(12) United States Patent
Epple

(10) Patent No.: US 7,446,952 B2
(45) Date of Patent: Nov. 4, 2008

(54) CATADIOPTRIC PROJECTION OBJECTIVE

(75) Inventor: Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/578,100

(22) PCT Filed: Apr. 7, 2005

(86) PCT No.: PCT/EP2005/003646

§ 371 (c)(1),
(2), (4) Date: Jun. 4, 2007

(87) PCT Pub. No.: WO2005/098506

PCT Pub. Date: Oct. 20, 2005

(65) Prior Publication Data

US 2008/0002265 A1 Jan. 3, 2008

Related U.S. Application Data

(60) Provisional application No. 60/560,267, filed on Apr. 8, 2004.

(51) Int. Cl.
*G02B 17/08* (2006.01)
(52) U.S. Cl. ........................ 359/731; 359/730
(58) Field of Classification Search .............. 359/730, 359/731, 732, 733
See application file for complete search history.

(56) References Cited

U.S. PATENT DOCUMENTS 5,515,207 A 5/1996 Foo (Continued)

FOREIGN PATENT DOCUMENTS

EP 1069448 A1 1/2001

(Continued)

OTHER PUBLICATIONS

Chinese Office Action (Feb. 1, 2008) of Chinese Patent Application No. 200580018858.X; "Catadioptric Projection Objective"; Carl Zeiss Smt Ag.*

(Continued)

*Primary Examiner*—Scott J Sugarman
(74) *Attorney, Agent, or Firm*—Sughrue Mion, PLLC

(57) ABSTRACT

A catadioptric projection objective for imaging an off-axis effective object field arranged in an object surface of the projection objective onto an off-axis effective image field arranged in an image surface of the projection objective has: an optical axis; an effective object field situated entirely outside the optical axis and having a length A in a first direction and a width B in a second direction perpendicular to the first direction such that a circular area of minimum size enclosing the effective object field defines a radius $R_{EOF}$ of the effective object field according to:

$$R_{EOF} = \sqrt{(A/2)^2 + (B/2)^2} \; ;$$

and a circular design object field centered around the optical axis having a design object field radius $R_{DOF}$, where the projection objective is essentially corrected with respect to image aberrations in zones having radial coordinates smaller than $R_{DOF}$ and wherein the projection objective is not fully corrected in zones having radial coordinates larger than $R_{DOF}$. The conditions: $R_{DOF} = \gamma R_{EOF}$ and $1 \leq \gamma < 1.4$ are fulfilled. Very high image-side numerical apertures NA>1 are possible with a compact design. Arcuate effective object fields are preferably used.

45 Claims, 11 Drawing Sheets

U.S. PATENT DOCUMENTS

| | | |
|---|---|---|
| 6,600,608 B1 | 7/2003 | Shafer et al. |
| 7,312,463 B2 * | 12/2007 | Omura .................. 250/492.2 |
| 2002/0024741 A1 | 2/2002 | Terasawa et al. |
| 2002/0057424 A1 | 5/2002 | Shima |
| 2003/0147130 A1 | 8/2003 | Terasawa |
| 2003/0234912 A1 | 12/2003 | Omura |
| 2003/0234992 A1 | 12/2003 | Shafer |
| 2004/0012866 A1 | 1/2004 | Mann et al. |
| 2004/0027653 A1 | 2/2004 | Shafer et al. |
| 2004/0130806 A1 | 7/2004 | Takahashi |
| 2004/0160677 A1 | 8/2004 | Epple et al. |
| 2004/0189965 A1 | 9/2004 | Takahashi |
| 2004/0218164 A1 | 11/2004 | Kohno |
| 2005/0190435 A1 | 9/2005 | Shafer et al. |

FOREIGN PATENT DOCUMENTS

| | | |
|---|---|---|
| EP | 1 098 215 A | 5/2001 |
| EP | 1098215 A1 | 5/2001 |
| EP | 1 336 887 A | 8/2003 |
| EP | 1335228 A1 | 8/2003 |
| EP | 1336887 A1 | 8/2003 |
| EP | 1413909 A1 | 4/2004 |
| JP | 2003015040 A | 1/2003 |
| JP | 2003 114387 A | 4/2003 |
| JP | 2003114387 | 4/2003 |
| JP | 2005-003982 | 6/2005 |
| WO | WO 01/55767 A2 | 8/2001 |
| WO | WO 2004/107011 A1 | 9/2004 |

OTHER PUBLICATIONS

Erhard Glatzel, "New lenses for microlithography", SPIE-The International Society for Optical Engineering, 1980, pp. 310-320, SPIE vol. 237.

Ulrich et al. "Trends in Optical Design of Projection Lenses . . . " in Winfried M. Kaiser et al., "Soft X-Ray and EUV Imaging Systems", Proceedings of SPIE, Aug. 2000, pp. 13-24, vol. 4146.

Tomoyuki Matsuyama et al., "Microlithographic lens for DUV scanner", Proceedings of SPIE, 2002, pp. 170-174, vol. 4832.

Tomoyuki Matsuyama et al., "High NA and low residual aberration projection lens for DUV scanner", Proceedings of SPIE, 2002, pp. 687-695, vol. 4691.

Erhard Glatzel, "Zeiss Information" 1981, pp. 8-13, vol. 26, Issue 92, Oberkochen, Germany.

Tomoyuki Matsuyama, "Nikon Projection Lens Update" in Bruce W. Smith et al., "Optical Microlithography XVII", Proceedings of SPIE, 2004, pp. vol. 5377.65.

* cited by examiner

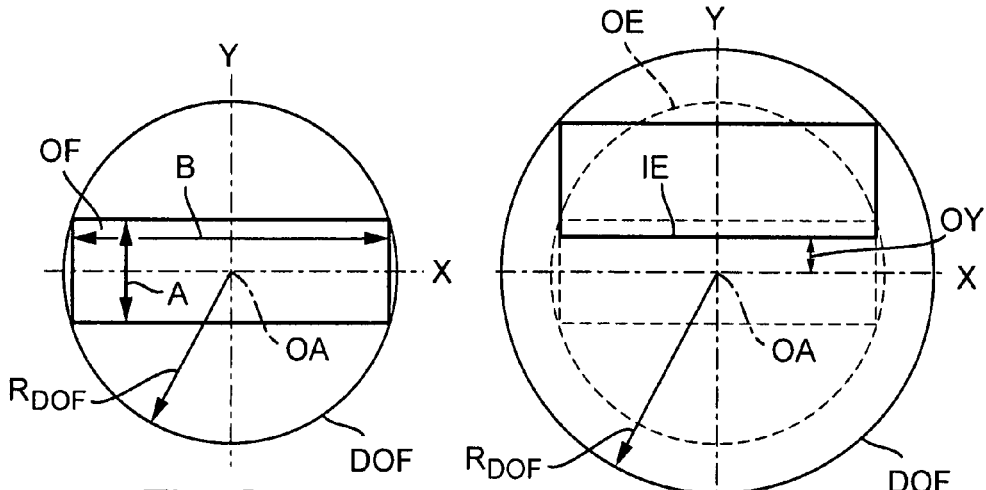
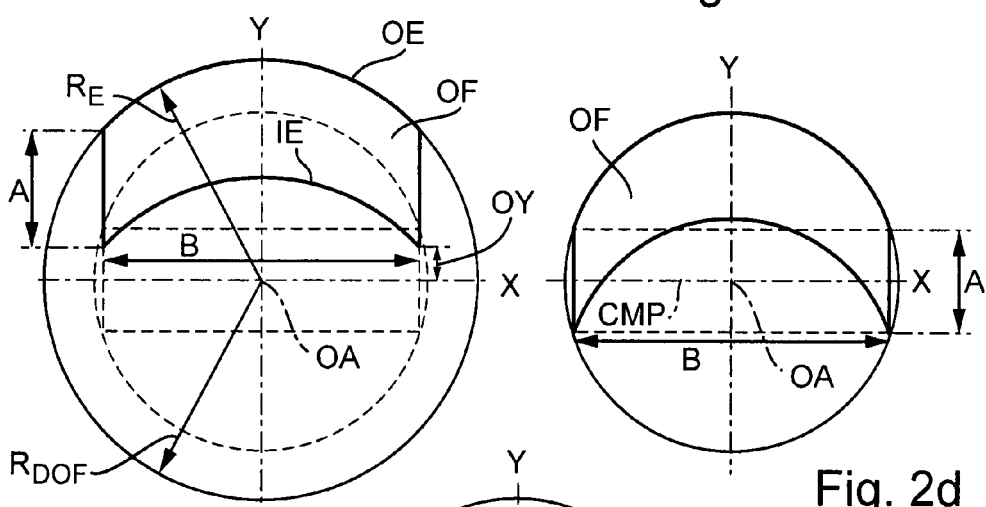
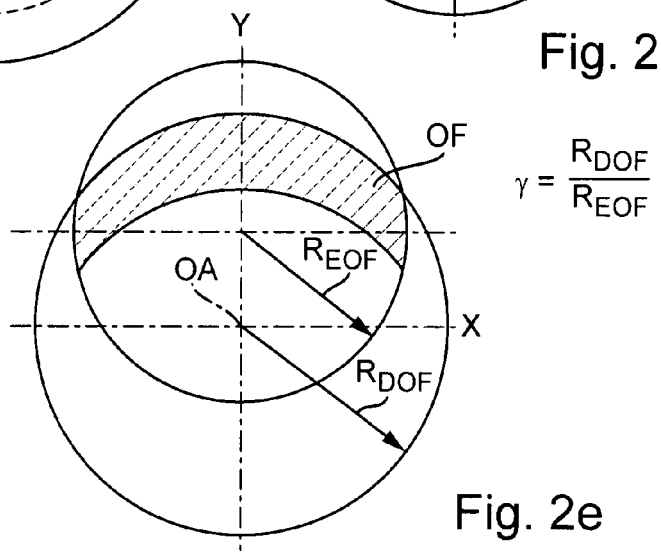
$$\gamma = \frac{R_{DOF}}{R_{EOF}}$$

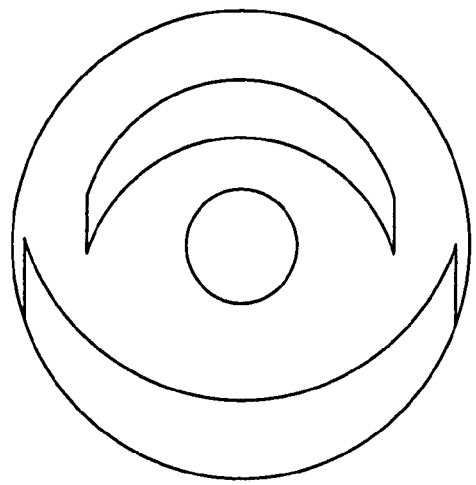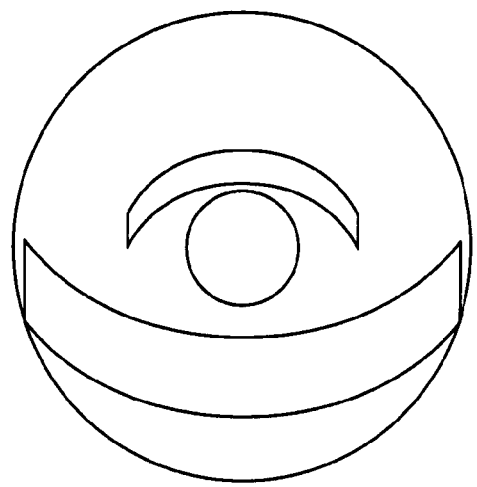
Fig. 6a        Fig. 6b
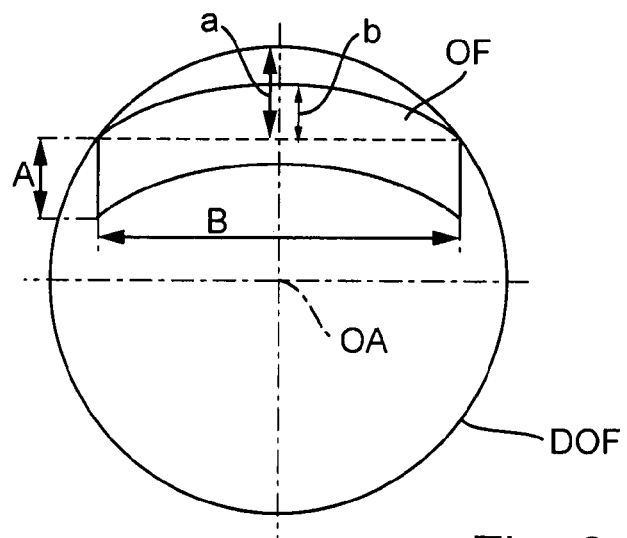
Fig. 6c

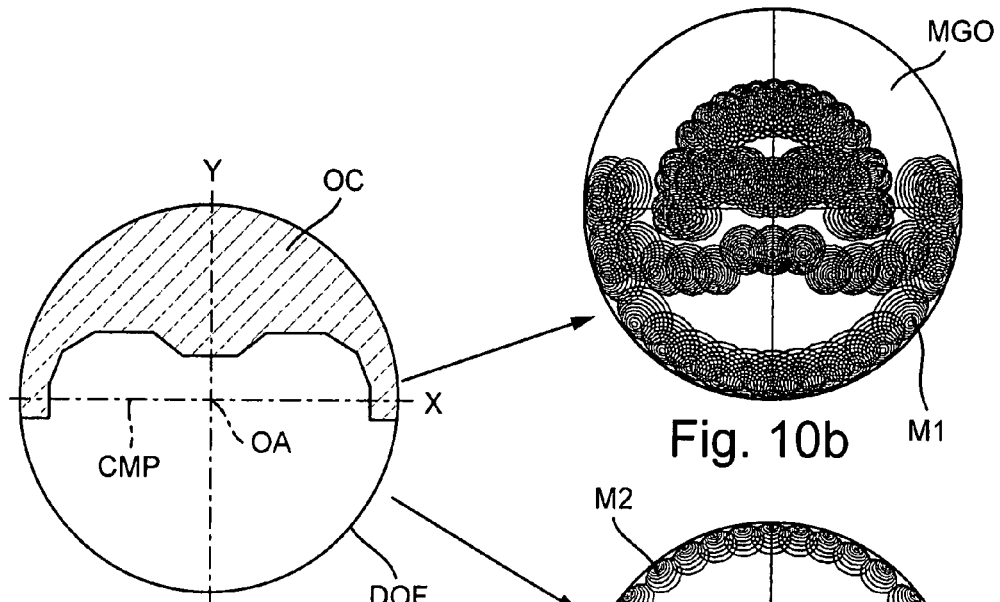
Fig. 10a
Fig. 10b
Fig. 10c
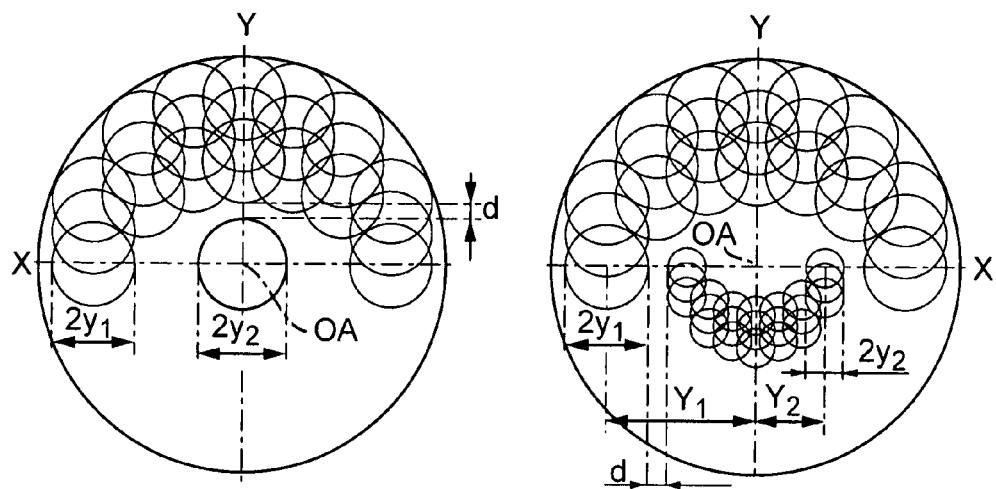
Fig. 11
Fig. 12

CATADIOPTRIC PROJECTION OBJECTIVE

This application claims priority from U.S. provisional application 60/560,267 filed on Apr. 8, 2004. The complete disclosure of that provisional application is incorporated into this application by reference.

BACKGROUND OF THE INVENTION

1. Field of the Invention

The invention relates to a catadioptric projection objective for imaging an off-axis effective object field arranged in an object surface of the projection objective onto an off-axis effective image field arranged in an image surface of the projection objective.

2. Description of the Related Art

Catadioptric projection objectives are, for example, employed in projection exposure systems, in particular wafer scanners or wafer steppers, used for fabricating semiconductor devices and other types of micro-devices and serve to project patterns on photomasks or reticles, hereinafter referred to generically as "masks" or "reticles," onto an object having a photosensitive coating with ultrahigh resolution on a reduced scale.

In order to create even finer structures, it is sought to both increase the image-end numerical aperture (NA) of the projection objective and employ shorter wavelengths, preferably ultraviolet light with wavelengths less than about 260 nm. However, there are very few materials, in particular, synthetic quartz glass and crystalline fluorides, that are sufficiently transparent in that wavelength region available for fabricating the optical elements. Since the Abbe numbers of those materials that are available lie rather close to one another, it is difficult to provide purely refractive systems that are sufficiently well color-corrected (corrected for chromatic aberrations).

The high prices of the materials involved and limited availability of crystalline calcium fluoride in sizes large enough for fabricating large lenses represent problems. Measures that allow reducing the number and sizes of lenses employed and simultaneously contribute to maintaining, or even improving, imaging fidelity are thus desired.

In optical lithography, high resolution and good correction status have to be obtained for a relatively large, virtually planar image field. It has been pointed out that the most difficult requirement that one can ask of any optical design is that it have a flat image, especially if it is an all-refractive design. Providing a flat image requires opposing lens powers and that leads to stronger lenses, more system length, larger system glass mass, and larger higher-order image aberrations that result from the stronger lens curvatures. Conventional means for flattening the image field, i.e. for correctings the Petzval sum in projection objectives for microlithography are discussed in the article "New lenses for microlithography" by E. Glatzel, SPIE Vol. 237 (1980), pp. 310-320.

Concave mirrors have been used for some time to help solve problems of color correction and image flattening. A concave mirror has positive power, like a positive lens, but the opposite sign of Petzval curvature. Also, concave mirrors do not introduce color problems. Therefore, catadioptric systems that combine refracting and reflecting elements, particularly lenses and one or more concave mirrors, are primarily employed for configuring high-resolution projection objectives of the aforementioned type. Unfortunately, a concave mirror is difficult to integrate into an optical design, since it sends the radiation right back in the direction it came from. Intelligent designs integrating concave mirrors without causing mechanical problems or problems due to beam vignetting or pupil obscuration are desirable.

A further design goal is to optimize the size and shape of the object field which can be effectively imaged by the projection objective without vignetting at a given numerical aperture. The corresponding object field will be denoted in "effective object field" in the following. The size of the effective object field and the size of the corresponding effective image field are related through the magnification factor of the projection objective. Often it is desired to maximize the size of the effective fields in order to improve productivity of manufacturing processes involving the projection objective. For a given object-side numerical aperture, the size of an effective object field corresponds to an "effective geometrical light conductance value" (or "effective etendue"), which is defined herein as the product of the object-side numerical aperture and the radius $R_{EOF}$ of a circle having minimum size including the effective object field.

A further parameter to be observed when designing a projection objective is the size of the object field for which the projection objective must be sufficiently corrected with respect to image aberrations in order to obtain the desired performance. The aberrations include chromatic aberrations, image curvature aberration, distortion, spherical aberrations, astigmatism etc. The field, for which the projection objective must be sufficiently corrected, will be denoted "design object field" in the following. As the number and sizes of optical elements typically increase drastically if the size of the design object field is to be increased, it is generally desired to minimize the size of the design object field. At a given object-side numerical aperture, a projection objective may be characterized by a specific value for the "design etendue", which is defined in this application as the product between the object-side numerical aperture and the outer radius $R_{DOF}$ of the design object field, i.e. the design object field radius.

In purely refractive projection objectives an effective object field centered around the optical axis can be used. Likewise, a centered effective object field can be used in catadioptric projection objectives having a physical beam splitter, e.g. a beam splitter having a polarization selective beam splitter surface, or in systems having central pupil obscuration. In such systems the effective etendue equals the design etendue (i.e. $R_{EOF}=R_{DOF}$) indicating that an optimum size effective field can be used with a minimum size of the design object field. However, as colour correction becomes increasingly difficult in high aperture refractive projection objectives and since designs having physical beam splitters may be difficult to handle in terms of polarization control, alternative catadioptric designs (off-axis systems) have been developed, which can be subdivided into designs using geometrical beam splitting with one or more planar folding mirrors and so-called "in-line systems" having one straight (unfolded) optical axis common to all optical elements.

In these off-axis systems, an off-axis effective object field, i.e. an effective object field positioned entirely outside the optical axis, must be used to avoid vignetting. Both rectangular effective object fields and effective object fields having an arcuate shape, typically denoted as "annular field" or "ring field" have been proposed in this type of designs.

Representative examples for folded catadioptric projection objectives using planar folding mirrors in combination with a single catadioptric group having a concave mirror near or at a pupil surface and negative refractive power in front of the concave mirror are given in US 2003/0234912 A1 or US 2004/0160677 A1. These types of designs are typically used with a rectangular effective object field.

Various catadioptric in-line projection objectives have been proposed, From an optical point of view, in-line systems may be favorable since optical problems caused by utilizing planar folding mirrors, such as polarization effects, can be avoided. Also, from a manufacturing point of view, in-line systems may be designed such that conventional mounting techniques for optical elements can be utilized, thereby improving mechanical stability of the projection objectives.

The patent U.S. Pat. No. 6,600,608 B1 discloses a catadioptric in-line projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and a field centered around the optical axis and provides good color correction axially and laterally. However, since the reflecting areas of the concave mirrors exposed to the radiation are interrupted at the bores, the pupil of the system is obscured.

The Patent EP 1 069 448 B1 discloses catadioptric projection objectives having two concave mirrors facing each other and an off-axis object and image field. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors is disclosed in US patent application US 2002/0024741 A1.

US patent application US 2004/0130806 (corresponding to European patent application EP 1 336 887) discloses catadioptric projection objectives having off-axis object and image field, one common straight optical axis and, in that sequence, a first catadioptric objective part for creating a first intermediate image, a second catadioptric objective part for creating a second intermediate image from the first intermediate image, and a refractive third objective part forming the image from the second intermediate image. Each catadioptric system has two concave mirrors facing each other. The intermediate images lie outside the intermirror spaces defined by the concave mirrors.

Japanese patent application JP 2003114387 A and international patent application WO 01/55767 A disclose catadioptric projection objectives with off-axis object and image field having one common straight optical axis, a first catadioptric objective part for forming an intermediate image and a second catadioptric objective part for imaging the intermediate image onto the image plane of this system. Concave and convex mirrors are used in combination.

US patent application US 2003/0234992 A1 discloses catadioptric projection objectives with off-axis object and image field having one common straight optical axis, a first catadioptric objective part for forming an intermediate image, and a second catadioptric objective part for imaging the intermediate image onto the image plane. In each catadioptric objective part concave and convex mirrors are used in combination with one single lens.

International patent application WO 2004/107011 A1 discloses various catadioptric projection objectives with off-axis object field and image field having one common straight optical axis designed for immersion lithography using an arc shaped effective object field having a field center far away from the optical axis. The projection objectives include various types of mirror groups having two, four or six curved mirrors. Embodiments with two to four intermediate images are disclosed. US patent application US 2004/0218164 A1 discloses illumination systems designed for providing an arc shaped illumination field. A combination with a catadioptric projection objective with a polarization-selective physical beam splitter is also disclosed.

US provisional application with Ser. No. 60/536,248 filed on Jan. 14, 2004 by the applicant discloses a catadioptric projection objective having very high NA and suitable for immersion lithography at NA>1. The projection objective comprises: a first objective part for imaging the pattern provided in the object plane into a first intermediate image, a second objective part for imaging the first intermediate imaging into a second intermediate image, and a third objective part for imaging the second intermediate imaging directly onto the image plane. The second objective part includes a first concave mirror having a first continuous mirror surface and a second concave mirror having a second continuous mirror surface, the concave mirror surfaces facing each other and defining an intermirror space. All mirrors are positioned optically remote from a pupil surface. The system has potential for very high numerical apertures at moderate lens mass consumption.

SUMMARY OF THE INVENTION

It is an object of the invention to provide a compact catadioptric in-line projection objective that can be built with relatively small amounts of transparent optical material. It is another object of the invention to provide a catadioptric in-line projection objective for microlithography suitable for use in the vacuum ultraviolet (VUV) range having potential for very high image side numerical aperture which may extend to values allowing immersion lithography at numerical apertures NA>1. It is another object of the invention to provide a catadioptric in-line projection objective having an axially compact arrangement of mirrors effective for compensating image curvature abberations caused by lenses with positive power within the projection objective. It is another object of the invention to provide a catadioptric projection objective having a beneficial ratio between the size of the object field effectively used for projection and the size of the field for which the projection objective must be corrected with respect to image aberrations. It is another object of the invention to provide a catadioptric in-line projection objective allowing an optimum shape of the object field effectively used for projection to minimize the size of the field for which the projection objective must be corrected with respect to image aberrations.

As a solution to these and other objects the invention, according to one formulation, provides a catadioptric projection objective for imaging an off-axis effective object field arranged in an object surface of the projection objective onto an off-axiseffective image field arranged in an image surface of the projection objective comprising an optical axis;

an effective object field situated entirely outside the optical axis and having a length A in a first direction and a width B in a second direction perpendicular to the first direction such that a circular area of minimum size enclosing the effective object field defines a radius $R_{EOF}$ of the effective object field according to:

$$R_{EOF} = \sqrt{(A/2)^2 + (B/2)^2}\,;$$

a circular design object field centered around the optical axis having a design object field radius $R_{DOF}$, where the projection objective is essentially corrected with respect to image aberrations in zones having radial coordinates smaller than $R_{DOF}$ and wherein the projection objective is not fully corrected in zones having radial coordinates larger than $R_{DOF}$, wherein the following conditions are fulfilled:

$R_{DOF} = \gamma R_{EOF}$ and $1 \leq \gamma < 1.4$

Projection objectives according to this aspect of the invention allow using a large effective object field while at the same time the object field radius for which the projection objective must be sufficiently corrected may be relatively small even at high numerical apertures, such that image-side numerical apertures NA>1 for immersion lithography become available with projection objectives being compact in size in radial direction, i.e. with small lens and mirror diameters.

In preferred embodiments smaller values for γ are obtained such that γ may be smaller than 1.3 or even smaller than 1.2. Embodiments with γ deviating from 1 by about 5% or less are discussed below.

In some embodiments particularly suited for obtaining large NA-values the optical design is optimized for an arc shaped off-axis ring field, which may particularly be dimensioned such that lateral edge regions of the effective object field in a width direction perpendicular to the length direction overlap a cross-meridional plane through the optical axis, while a center section of the inner edge has a radial distance $D_I$ from the optical axis in the length direction. That distance may become rather small, i.e. the effective object field may be positioned very close to the optical axis. In some embodiments the distance $D_I$ amounts to no more than 60% of the design object field radius $R_{DOF}$.

Preferred embodiments have an even number of mirrors, particularly an even number of curved mirrors, where all curved mirrors are concave mirrors. In some embodiments, exactly two concave mirrors are provided in a mirror group. In other embodiments, exactly four concave mirrors are provided in a mirror group. At least one concave mirror may be an aspherical mirror to allow for improved correction of aberrations, particularly pupil spherical aberration.

According to another formulation, the invention provides a catadioptric projection objective for imaging an off-axis effective object field arranged in an object surface of the projection objective onto an off-axis effective image field arranged in an image surface of the projection objective comprising in that order along an optical axis:

a front lens group having positive refractive power for converging radiation coming from the effective object field towards a mirror group entry of a mirror group;

the mirror group having an object side mirror group entry and an image side mirror group exit; and a rear lens group with positive refractive power for focussing radiation emerging from the mirror group exit onto the effective image surface;

wherein the mirror group includes at least two curved mirrors, where a curved mirror has a curved mirror surface for receiving radiation of a projection beam passing from the effective object field to the effective image field in a reflecting first area, the curved mirror surface defining a curvature surface including the mirror surface and extending beyond edges of the curved mirror;

where the projection beam is incident on the curvature surface at least once in a second area offset to the reflecting first area;

and where for all curved mirrors the conditions:

$|R_{CRH}| < 1/\alpha$ or $|R_{CRH}| > \alpha$       (1)

and $\alpha = 1,4$       (2)

are fulfilled for a chief ray height ratio $R_{CRH} = CRH_1/CRH_2$ between a first chief ray height $CRH_1$ of a chief ray in the reflecting first area and a second chief ray height $CRH_2$ of the same chief ray in the associated second area.

It has been found that large off-axis effective object fields can be obtained for designs for a relatively small design object field at high numerical apertures if the cross-section of the projection beam is controlled such that segments of the projection beam in the region of concave mirrors can be interleaved or nestled into each other. It has been found that this is facilitated by guiding and shaping the projection beam such that the chief ray height of the projection beam at comparable axial position in the region where the projection beam is guided to and from concave mirrors or past an edge of a concave mirror differ significantly. A large difference in chief ray heights allows significantly different sizes of field footprints (e.g. beam cross-sections in the vicinity of a field surface) such that an interleaved arrangement of footprints becomes possible.

Conditions (1) and (2) given above may also be worded in a sense that the conditions $1/\alpha < |R_{CRH}| < \alpha$ and $\alpha = 1,4$ should be fulfilled for none of the concave mirrors. With other words, values for $|R_{CRH}|$ equal to 1 or close to 1 should be avoided.

The invention further relates to a projection exposure system comprising an illumination system for receiving light from a light source and for forming an off-axis illumination field arranged outside an optical axis of the illumination system in an exit surface of the illumination system, and a catadioptric projection objective, where the illumination system is adapted to an embodiment of a catadioptric projection objective according to the invention. Preferably, the illumination system is designed for creating an arc shaped illumination field, which, in some embodiments, is dimensioned such that lateral edge regions of the illumination field in a width direction perpendicular to a length direction overlap a cross-meridional plane through the optical axis, while a center section of the inner edge has a radial distance from the optical axis in the length direction.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 2 illustrates the relationship between the shape and position of an effective object field, the associated effective object field radius and the associated design object field radius;

FIG. 6 illustrates footprints of an arcuate effective object field having various degrees of bending;

FIG. 10 shows a schematic drawing illustrating an optical channel defined by the optical elements of the projection objective of FIGS. 8 and 9;

FIGS. 11 and 12 show schematic representations of footprints in reflection and transmission to illustrate the influence of marginal ray heights and chief ray heights on shape and position of interleaved footprints.

DETAILED DESCRIPTION OF THE PREFERRED EMBODIMENTS

Figure 1:
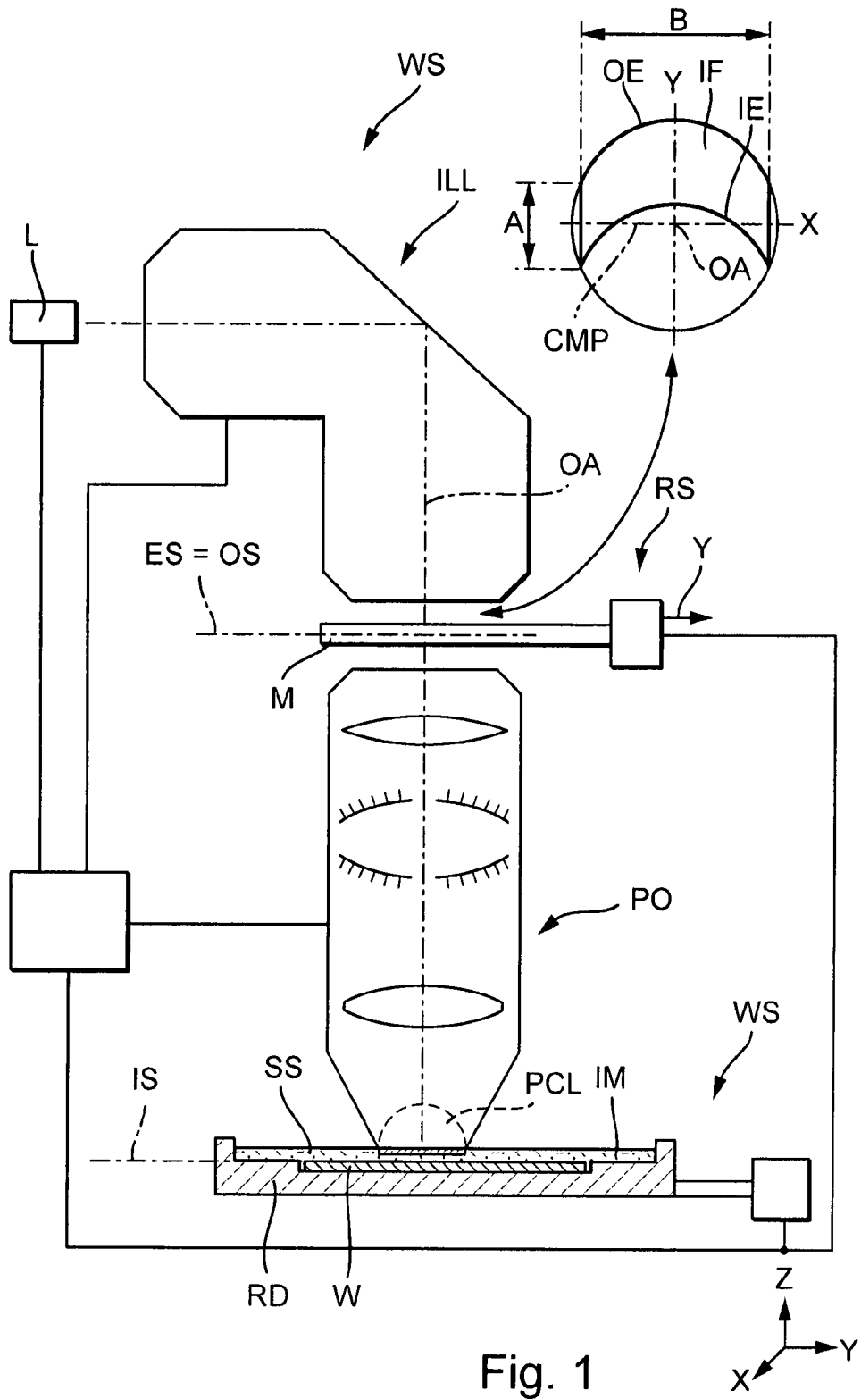
FIG. 1 shows a schematic drawing of a projection exposure system for microlithography having an illumination system designed for creating an arc shaped illumination field and a catadioptric projection objective having four concave mirrors.

In the following description of preferred embodiments of the invention, the term "optical axis" shall refer to a straight line or sequence of straight-line segments passing through the centers of curvature of the optical elements. In the case of those examples presented here, the object is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Embodiments having a plurality of mirrors are described. Unless stated otherwise, the mirrors will be numbered according to the sequence in which the radiation is reflected on the mirrors. With other words, the numbering of the mirrors denotes the mirrors according to the position along the optical path of radiation, rather than according to geometrical position.

The terms "front" and "rear" as well as the terms "upstream" and "downstream" relate to relative positions along the optical path, where "front" and "upstream" relate to positions closer to the object surface.

Where appropriate, identical or similar features or feature groups in different embodiments are denoted by similar reference identifications. Where reference numerals are used, those are increased by 100 or multiples of 100 between embodiments.

Where tables are provided to disclose the specification of a design shown in a figure, the table or tables are designated by the same numbers as the respective figures.

FIG. 1 shows schematically a microlithographic projection exposure system in the form of a wafer scanner WS, which is provided for fabricating large scale integrated semiconductor components by means of immersion lithography in a step-and-scan mode. The projection exposure system comprises as light source an Excimer laser L having an operating wavelength of 193 nm, other operating wavelengths, for example 157 nm or 248 nm, also being possible. A downstream illumination system ILL generates, in its exit surface ES, a large, sharply delimited, homogeneously illuminated illumination field IF that is adapted to the telecentric requirements of the downstream catadioptric projection objective PO. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that the mask lies in the exit surface ES of the illumination system coinciding with the object surface OS of the projection objective PO and can be moved in this plane for scanning operation in a scanning direction (Y-direction) perpendicular to the optical axis OA common to the illumination system and the projection objective (i.e. the Z-direction).

The reduction projection objective PO is designed to image an image of a pattern provided by the mask with a reduced scale of 4:1 onto a wafer W coated with a photoresist layer. Other reduction scales, e.g. 5:1 or 8:1 are possible. The wafer W serving as a light-sensitive substrate is arranged in such a way that the planar substrate surface SS with the photoresist layer essentially coincides with the planar image surface IS of the projection objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis OA and in the X and Y directions perpendicular to said axis. A tilting device having at least one tilting axis running perpendicular to the optical axis is integrated.

The device WS provided for holding the wafer W (wafer stage) is constructed for use in immersion lithography. It comprises a receptacle device RD, which can be moved by a scanner drive and the bottom of which has a flat recess for receiving the wafer W. A peripheral edge forms a flat, upwardly open, liquidtight receptacle for a liquid immersion medium IM, which can be introduced into the receptacle and discharged from the latter by means of devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a planoconvex lens PCL as the last optical element nearest to the image surface IS, the planar exit surface of said lens being the last optical surface of the projection objective PO. During operation of the projection exposure system, the exit surface of the last optical element is completely immersed in the immersion liquid IM and is wetted by the latter. In the exemplary case, ultrapure water having a refractive index $n_I \approx 1.437$ (193 nm) is used as the immersion liquid.

As shown schematically in the inset figure of FIG. 1, the illumination system ILL is capable of generating an illumination field IF having a arcuate shape (annular field or ring field). The size and shape of the arcuate illumination field determines the size and shape of the effective object field OF of the projection objective actually used for projecting an image of a pattern on a mask in the image surface of the projection objective. The illumination field IF has a length A parallel to the scanning direction and a width B perpendicular to the scanning direction. A curved inner edge IE closer to the optical axis and an outer edge OE further away from the optical axis and radially off-set in Y-direction by length A have the same edge radius. Lateral edge regions in the width direction (X-direction) overlap a cross-meridional plane CMP defined by the X-direction and the optical axis (Z-direction), whereas a centersection of the inner edge IE on the Y-axis has a radial distance from the optical axis. It is a characterizing feature that the illumination field does not include the optical axis (off-axis illumination field), but extends on both sides across the cross-meridional plane perpendicular to the scanning direction. The particular conditions at the interface between the illumination system and projection objective, which are also discussed in connection with FIG. 2 and various embodiments of the projection objective, enable use of high NA immersion objectives having compact axial and radial dimensions, as will be explained in detail below.

As an introduction to one of the problems solved by the invention, FIG. 2 shows various schematic figures of axial views on the object-field side of projection objectives to illustrate how an effective object field OF actually used in a microlithographic projection process may be placed within a design object field DOF of a projection objective.

FIGS. 2(a) to (c) show examples of conventional designs, whereas FIG. 2(d) shows an embodiment of the invention (compare inset figure in FIG. 1). The terms $R_{DOF}$ and $R_{EOF}$ are illustrated in (e). In all examples, the size of the effective object field OF with regard to length A and width B, and therefore the aspect ratio AR=B/A is identical. Preferably, the aspect ratio may be in the range from 2:1 to 10:1. A circular area enclosing the effective object field has a radius $R_{EOF}$, which is identical in all examples of FIG. 2. In each example, the effective object field OF is positioned with respect to the optical axis OA such that all field points within the effective object field are imaged, at a given numerical aperture, without vignetting of the projection beam.

The design object field DOF is a circular area of minimum radius $R_{DOF}$ concentric with the optical axis OA enclosing the effective object field. The design object field includes all field points of the object surface which can be projected by the projection objective with an imaging fidelity sufficient for the intended lithographic process. With other words: within zones having radial coordinates smaller than $R_{DOF}$ all imaging aberrations are corrected sufficiently for the intended projection purpose, whereas at least one of the aberrations is higher than a desired threshold value for field points outside of the design object field. Depending on the shape and position of the effective object field all field points of the design object field, including field points on and close to the optical axis, may be sufficiently corrected. In projection objectives designed for off-axis effective object fields, particularly those having an arcuate shape, it may be possible that the field points having sufficient correction status form a ring zone around the optical axis (including the position of the effective object field), whereas the region on and around the optical axis may not need to be sufficiently corrected. The size of the design object field is characterized by the design object field radius $R_{DOF}$. As correction of a projection objective becomes easier the smaller the design object field radius is, it is generally desireable to minimize the design object field radius.

On the other hand, in order to obtain an efficient projection process, e.g. for manufacturing microstructured semiconductor devices, it is desirable to have a sufficiently large size of the effectively used object field OF. In most projection exposure systems designed for a scanning operation a slit-shaped object field OF is used and the pattern to be imaged as well as the substrate to be exposed are synchronously moved in a scanning direction Y during a projecting step. Conventionally, a rectangular effective object field OF having a length A parallel to the scanning direction Y and a width B perpendicular to the scanning direction is used (compare (a) and (b)). It is also known to use arcuate object fields, which are often called "annular field" or "ring field". As demonstrated in figure (c) an arcuate field may be dimensioned to have the same width B in cross-scan direction X (perpendicular to the scanning direction Y). An inner edge IE closer to the optical axis and an outer edge OE further remote from the optical axis have the same edge radius $R_E$, which incidently corresponds to the design object field radius $R_{DOF}$ in the example of figure (c) but may be different from that radius (compare FIG. 6) depending on the bending of the effective object field. The length A of the effective object field OF is determined by the radial off-set between inner edge IE and outer edge OE in scanning direction Y.

As noted above, a circular area enclosing the effective object field has a radius $R_{EOF}$, which is only dependent from A and B and which is calculated as follows for all examples:

$$R_{EOF} = \sqrt{(A/2)^2 + (B/2)^2}$$

The example (a) shows an effective object field OF centered around the optical axis OA, which is typical for purely refractive projection objectives, or catadioptric projection objectives having a physical beam splitter, such as a polarization beam splitter, or catadioptric projection objectives having a central pupil obscuration. Here, the following condition holds for the design object field radius $R_{DOF}^{cent}$ of a centered effective object field:

$$R_{DOF}^{cent} = R_{EOF}$$

Considering that the "effective etendue" is defined herein as the product of the object-side numerical aperture and the radius $R_{EOF}$ of the effective object field, whereas the "design etendue" is defined herein as the product of the object-side numerical aperture and the radius $R_{DOF}$ of the design object field, an etendue ratio γ is defined as follows:

$$\gamma = R_{DOF}/R_{EOF}$$

It follows that designs having a centered effective object field have an optimum etendue ratio γ=1 indicating that relatively large effective object fields can be imaged with relatively small sized design object fields.

As explained in the outset of the specification, centered effective object fields cannot be used in catadioptric projection objectives having one or more planar folding mirrors for guiding radiation to and/or from a concave mirror. Instead, an off-axis object field must be used. An example is shown in (b). As a minimum requirement, the inner edge IE of the rectangular effective object field OF would have to be placed just outside the optical axis OA where Y≈0. In this case, the radius $R_{DOF}^{exc-min}$ of the design object field around that excentric (off-axis) effective object field would satisfy the following condition:

$$R_{DOF}^{exc-min} = \sqrt{(B/2)^2 + A^2} > R_{EOF}$$

In realistic systems, however, a finite offset OY will exist between the inner edge IE of the effective object field OF and the optical axis OA since manufacturing tolerances will have to be observed and since it is generally not recommended or possible to place an intermediate image exactly on a folding mirror. Therefore, it is contemplated that a reasonable lowest value for the design object field radius, $R_{DOF}^{exc-real}$, for a rectangular effective object field in this realistic case will observe the following condition:

$$R_{DOF}^{exc-real} = 1.05 \cdot \sqrt{(B/2)^2 + A^2} > R_{EOF}$$

It is evident from comparison between FIGS. 2(a) and (b) that projection objectives with off-axis effective object field generally require a larger radius of the design object field. For a given numerical aperture this requirement generally corresponds to the need to increase the size of lenses and other optical elements as compared to purely refractive systems or other systems having a centered effective object field.

Similar considerations hold when off-axis arcuate fields are used (compare (c)). Typically, a minimum offset OY in the scanning direction is needed to avoid vignetting.

As will be shown later, catadioptric in-line projection objectives according to preferred embodiments of the invention allow to image without vignetting an effective object field having length A and width B positioned within a design object field having radius $$R_{DOF}^{\gamma} = \gamma\sqrt{(A/2)^2 + (B/2)^2} = \gamma R_{EOF}$$

where $1 \leq \gamma < 1.4$

Considering that preferable designs having a rectangular effective object field have been found to be characterized by $\gamma \geq 1.4$ or more improvements towards a more favorable etendue ratio are obtained by designing the projection objectives such that an arcuate effective object field with a predetermined shape can be imaged without vignetting. Here an etendue ratio γ<1.2 can be obtained. In some embodiments the off-axis effective object field is allowed to overlap a cross-meridional plane CMP in lateral edge regions (see FIG. 2(d)). Here etendue ratios γ<1.1 can be obtained.

Preferred embodiments of catadioptric projection objectives adapted to be used in a microlithographic projection exposure system as exemplarily described in connection with FIG. 1 will now be described in detail.

In all embodiments given below the surfaces of curvature of all curved mirrors have a common axis of rotational symmetry, also denoted mirror group axis. The mirror group axis coincides with the optical axis OA of the projection objective. Catadioptric projection objectives having an even number of mirrors, particularly axially symmetric systems, also named in-line systems, are provided this way. No planar folding mirrors are used or needed in these designs. The effective object field and image field are off-axis, i.e. positioned at a radial distance from the optical axis. All systems have a circular pupil centered around the optical axis thus allowing use as projection objectives for microlithography.

Figure 3:
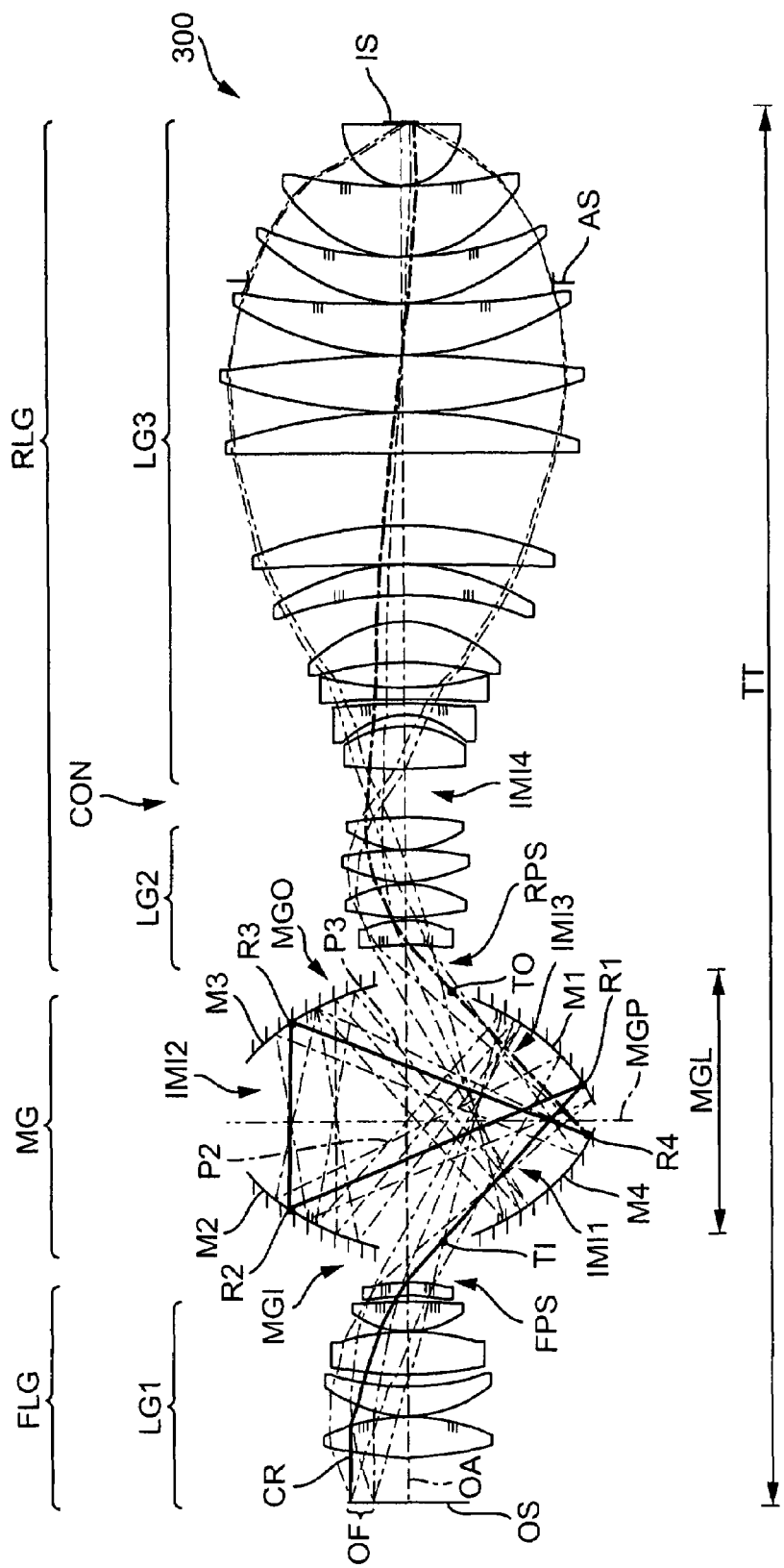
FIG. 3 shows a meridional lens section of an embodiment of a catadioptric in-line projection objective having a mirror group with four concave mirrors.

FIG. 3 shows a meridional lens section (in a Y-Z-plane) of an embodiment of a catadioptric projection objective 300 designed to project an image of a pattern on a reticle arranged in the planar object surface OS (object plane) onto a planar image surface IS (image plane) on a reduced scale, for example 4:1, while creating exactly four real intermediate images IMI1, IMI2, IMI3 and IMI4. An off-axis effective object field OF positioned outside the optical axis OA is thereby projected on an off-axis image field IF. The effective object field OF is an arcuate "ring field" shaped generally in accordance with FIG. 2(d). The trajectory of a chief ray CR of an outer field point of the off-axis object field OF in the meridional plane (drawing plane) is drawn bold in order to facilitate following the beam path.

For the purpose of this application, the term "chief ray" (also known as principal ray) denotes a ray emanating from an outermost field point (farthest away from the optical axis) of the effectively used object field OF and intersecting the optical axis at at least one pupil surface position.

Due to the rotational symmetry of the system the chief ray may be chosen from an equivalent field point in the meridional plane with object height $R_{DOF}$, as shown in the figures for demonstration purposes. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (on the optical axis) to the edge of an aperture stop AS. That marginal ray may not contribute to image formation due to vignetting when an off-axis effective object field is used. The chief ray and marginal ray are chosen to characterize optical properties of the projection objectives.

A first lens group LG1 immediately following the object surface having positive refractive power provided by five lenses acts as an imaging subsystem to form the first intermediate image IMI1. A front pupil surface FPS formed between object surface and first intermediate image is positioned in an image-side end region of the first lens group LG1 at an axial position where the chief ray CR intersects the optical axis OA.

A purely reflective (catoptric) mirror group MG consisting of four concave mirrors M1, M2, M3 and M4 arranged mirror symmetrically with respect to a mirror group plane MGP perpendicular to the optical axis is designed to form a second intermediate image IMI2 from the first intermediate image, and a third intermediate image IMI3 from the second intermediate image. All intermediate images IMI1, IMI2, IMI3 are positioned inside a catadioptric cavity defined by the concave mirrors.

A second lens group LG2 having positive refractive power provided by four positive lenses is an imaging subsystem forming a fourth intermediate image IMI4 from the third intermediate image IMI3. A rear pupil surface RPS formed between the third and fourth intermediate image lies in an entry region of the second lens group close to the entry surface of the first lens of that group.

A third lens group LG3 having positive refractive power provided by twelve lenses (only two negative lenses) is designed as a focusing lens group with reducing magnification to image the fourth intermediate image IMI4 onto the image surface IS on a reduced scale.

A constriction region CON characterized by a local minimum of beam diameter is defined between the second and third lens group LG2 and LG3 including the position of the fourth intermediate image IMI4.

The first lens group LG1 forms a front lens group FLG designed to converge the radiation coming from the object field towards the mirror group entry. The second lens group LG2 and the third lens group LG3 in combination serve as a rear lens group RLG for focusing the radiation emerging from the mirror group exit MGO onto the image surface.

The purely reflective (catoptric) mirror group MG is designed to provide strong overcorrection of the Petzval sum counteracting opposite effects of positive refractive power of lenses upstream and downstream of the mirror group. To that end, the mirror group MG consists of a first concave mirror M1 placed on the side of the optical axis opposite to the object field OF, a second concave mirror M2 placed on the object field side of the optical axis, a third concave mirror M3 also placed on the object field side of the optical axis, and a fourth concave mirror M4 placed on the side opposite to the object field. Each mirror surface of a concave mirror defines a "curvature surface" or "surface of curvature" which is a mathematical surface extending beyond the edges of the physical mirror surface and containing that mirror surface. All concave mirrors are part of rotationally symmetric curvature surfaces having a common axis of rotational symmetry on the optical axis.

The object-side mirrors M2 and M4 form a mirror pair having a common surface of curvature formed on a common mirror substrate. A mirror group entry MGI is formed by a hole in the mirror substrate including the optical axis between mirrors M2 and M4. As the mirror arrangement is mirror symmetric to a symmetry plane (mirror group plane MGP) perpendicular to the optical axis, symmetric conditions are given on the exit side, where a mirror group exit MGO is formed by a hole in a common mirror substrate between the third mirror M3 and the first mirror M1. Both mirror group entry MGI and mirror group exit MGO include the optical axis.

The mirror group entry MGI has an axial position geometrically close to the front pupil surface FPS. Since the chief ray height (i.e. the radial distance between the optical axis and the chief ray) equals zero at the front pupil surface, an entry chief ray height CRHI in the transmissive portion at the mirror group entry is small. In FIG. 3, a dot TI illustrates the position where the chief ray transits the mirror group entry. After reflection on the first mirror M1, where the chief ray impinges at position R1 (dot), the radiation beam crosses the optical axis and is incident on the second mirror M2. The second reflecting area (footprint) on the second mirror includes the position R2 (dot) where the chief ray impinges on the second mirror. The corresponding second chief ray height CRH2 is larger than the first chief ray height (the ray height being determined in a radial direction to the optical axis with positive values on the side of the object field in this case).

After forming the second intermediate image and reflection on the third mirror M3 (chief ray impinges at R3), the radiation beam crosses the optical axis again and is incident on the fourth mirror M4 in a fourth reflecting area including the position R4 (dot) where the chief ray is reflected on the fourth mirror. The corresponding fourth chief ray height CRH4 is smaller than the entry chief ray height CRHI. Also, the second and fourth chief ray heights CRH2 and CRH4 have opposite signs. Further, the first chief ray height CRH1 is smaller and the third chief ray height CRH3 is larger than the exit chief ray height CRHO determined where the beam exits the mirror group (at TO). Also, the first and third chief ray heights CRH1 and CRH3 have opposite signs.

The small absolute value of entry chief ray height CRHI indicates close vicinity of the mirror group entry to a pupil surface. In contrast, high absolute values of the chief ray heights for the second and fourth reflection indicate that these reflections occur optically remote from a pupil surface optically closer to a field surface nearby (IMI2 for the second reflection, and IMI3 for the fourth reflection). Due to the symmetry of the mirror group, the reflections on the first and third mirrors M1, M3 are also closer to field surfaces than to a pupil surface indicating that all reflections within the mirror group occur close to a field surface optically remote from a pupil surface.

Due to the symmetry of the mirror group, the front pupil surface FPS is positioned near the mirror group entry, whereas the optically conjugate rear pupil surface RPS lies near the mirror group exit. Inside the mirror group, three intermediate images (corresponding to field surfaces) are positioned. When viewed along the light propagation path, the first intermediate image IMI1 is positioned upstream of the first reflection at M1, the second intermediate image IMI2 is positioned between the second and the third reflection between mirrors M2 and M3, and a third intermediate image IMI3 is positioned immediately downstream of the fourth reflection at M4. The mirror group plane MGP is passed five times by the projection beam between mirror group entry and mirror group exit.

An axial mirror group length MGL defined as the axial distance between a mirror vertex closest to the object surface (mirror M2, M4) and a mirror vertex closest to the image surface (mirror M1, M3) is less than 30% of the total track length TT of projection objective (axial distance between object surface and image surface), indicating an axially compact mirror group.

The second intermediate image is essentially telecentric indicated by the fact that the chief ray CR runs almost parallel to the optical axis in the region of the second intermediate image. An essentially collimated beam is present between the first and second mirrors M1, M2, forming a second pupil surface P2 close to the focal point of the second mirror. Likewise a collimated beam is present between the third and fourth mirror M3, M4, forming a third pupil surface P3 near the focal point of the third mirror M3.

The projection objective 300 is designed as an immersion objective for $\lambda=193$ nm having an image side numerical aperture NA=1,35 when used in conjunction with a high index immersion fluid, e.g. pure water, between the exit face of the objective and the image plane. specifications are summarized in Table 3. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical surface, the fourth column lists the material employed for fabricating that optical element, and the fifth column lists the refractive index of that material. The sixth column lists the optically utilizable, clear, semi diameter [mm] of the optical component. A radius r=0 in a table designates a planar surface (having infinite radius).

A number of surfaces in table 3, are aspherical surfaces. Table 3A lists the associated data for those aspherical surfaces, from which the sagitta or rising height p(h) of their surface figures as a function of the height h may be computed employing the following equation:

$$p(h)=[((1/r)h^2)/(1+SQRT(1-(1+K)(1/r)^2h^2))]+C1 \cdot h^4+C2 \cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 3A.

In the embodiment of FIG. 3, the object-side mirrors M2 and M4 have the same surface of curvature allowing to use a common mirror substrate for both mirrors. Likewise, the surfaces of curvature of the image-side mirrors M1, M3 are identical allowing to use a common substrate for these mirrors. However, the surfaces curvatures of the object-side mirrors and the image-side mirrors are different. In other embodiments, the object-side mirrors and the image-side mirrors may have identical surface curvatures, whereby manufacturing of the mirrors of the mirror group can be facilitated. Also, four separate mirror substrates can be provided, thereby allowing more flexibility for aberration control with respect to the surface curvatures and to the vertex position of each mirror.

Some considerations for obtaining a high geometrical light conductance value (etendue, product of numerical aperture and corresponding field size) for the effectively used field are presented in the following. As explained above, radiation enters the four-mirror-design at a mirror group entry MGI geometrically close to a pupil surface (front pupil surface FPS), and the mirror group exit MGO is also geometrically close to a pupil surface (rear pupil surface RPS) indicating that the mirror group performs a pupil imaging within the optical system. Further, each of the mirror surfaces is positioned optically close to a field surface (intermediate image) in a sense that the mirror is optically closer to a field surface than to a pupil surface of the optical system. Particularly, the chief ray height is larger than marginal ray height, even larger than twice the marginal ray height at the mirrors. In order to avoid vignetting of the beam in the region of the pupil surface, the beam must pass the geometrically closest edge of the mirrors forming the mirror group entry or mirror group exit. Regarding the footprints of the beams on the mirrors care must be taken that the entire footprint falls on a reflective area of the mirror instead of passing the edge of a mirror, which would cause vignetting. A further practical requirement is to obtain a sufficiently large effective object field as close as possible to the optical axis in order to minimize the design object field diameter for which the projection objective must be sufficiently corrected. Under these conditions, it has been found useful to design the optical systems such that the size of the pupil (i.e. the beam diameter of the beam at a pupil surface) is as small as possible at a pupil plane geometrically close to the mirror group entry and mirror group exit. A small pupil in this area allows to place a geometrically close field (on or near an adjacent mirror) as close as possible to the optical axis without the beam hitting the mirror edge. Further, considering that the product of paraxial chief ray angle CRA and the size of a pupil is a constant in an optical imaging system (Lagrange invariant) a small pupil corresponds to large chief ray angles at that pupil surface. In this context it has been found useful for catadioptric in-line systems having mirror groups of the type shown here that the maximum chief ray angle $CRA_{max}$ should exceed a critical value, thereby allowing to form a small pupil and an oblique beam path in the vicinity of a mirror group entry and mirror group exit which, in turn, allows to place a large off-axis object field close to the optical axis even at high numerical apertures.

The maximum chief ray angle $CRA_{max}$ at the front pupil surface FPS close to the mirror group entry is about 40° in FIG. 3. Useful values for $CRA_{max}$ may be in the range between about 20° and about 50°. At lower values, the pupil size increases such that it becomes more difficult to avoid vignetting without increasing the design object field diameter to be corrected. At values higher than the upper limit, mirror surfaces may have to extend too far away from the optical axis thereby enlarging the mirror group size in radial direction and making mirror manufacturing and mounting more difficult.

The projection objective is adapted to projecting radiation emanating from an arc shaped ring field similar to that shown in FIG. 2(d) without vignetting. Consequently, the design object field object radius $R_{DOF}$ is very close to a minimum design object field radius $R_{EOF}$ which can be obtained in systems with a centered on-axis object field (FIG. 2(a)). Here, a design object field radius $R_{DOF}$=56 mm is obtained for a ring field having B=26 mm and A=5,5 mm. With $R_{EOF}$=53,15 this corresponds to an etendue ratio γ=1,05.

Even smaller values for γ closer to γ=1 or even γ=1 can be obtained, if desired. However, more extremely shaped ring fields are necessary in this case.

Specific properties of the projection beam transitting the projection objective are now explained with reference to FIG. 4. In (a) the system of FIG. 3 is shown with the surfaces of curvature of the object side mirrors M2, M4 and the image-side mirrors M1, M3 extended across the optical axis to demonstrate that each pair of mirrors M1, M3 and M2, M4 may be formed on a common substrate as a mirror pair. In FIG. (b) and (c) "footprints" of the projection beam are shown. A "footprint" of a projection beam represents the size and shape of the projection beam at a given surface transverse to the optical axis. The beam footprints in the figures are obtained by an axial projection (parallel to the Z-direction) of field point footprints of selected field points on a surface of curvature of the object-side mirrors or the image-side mirrors. In FIG. 4(b) the projection shows the situation for the reflections on the object-side mirrors M2 and M4 close to the mirror group entry MGI and in the transmissive portion forming MGI where the projection beam enters the mirror group. In contrast, FIG. 4(c) shows the situation on the image-side mirrors M1 and M3 close to the mirror group exit MGO, thereby demonstrating the footprints of the reflections on the image-side mirrors M1, M3 and in the transmissive portion around the optical axis where the projection beam exits the mirror group MG.

On both sides, the central footprint including the optical axis and representing the projection beam upon entering or exiting the mirror group does not overlap with the kidney-shaped footprints above and below (in y-direction) representing the reflections on the mirrors on either side of the optical axis in the Y-direction. As there is no overlap between the footprints upon transition (at MGI or MGO) and the footprints representing the reflections at M1 to M4, beam vingetting is avoided near the entry or exit of the mirror group.

Further, the upper and lower footprint representing reflections at M2, M4 or M1, M3 respectively do not overlap. It is apparent that the footprints are interleaved without overlapping. This is made possible by the significantly different dimensions of the reflection footprints in the cross-scan direction (X-direction). In each case, the diameter of the footprint of the upper reflection (M2 or M3 respectively) in x-direction is less than 80% or less than 70% of the respective diameter of the lower reflection at M1, M4 respectively. The difference in size allows to interleave the footprints such that for each footprint, the lateral edges (in X-direction) extend across a cross-meridional plane CMP spanned by the optical axis and the cross-scan X-direction. As the footprints are allowed to interleave in this manner without overlapping, the arc shaped effective object field OF can be positioned close to the object field in a manner that lateral edges (in X-direction) extend across the X-Z plane (cross-meridional plane CMP)(see FIG. 2(a)). A very small radius of the design object field DOF can thereby be obtained, facilitating the optical design significantly.

In embodiments where the footprints on the mirrors do not overlap, as shown in FIGS. 4(b)(c) the respective mirrors of the mirror group may be designed as physically separate mirrors, which may have identical or similar vertex positions. The physical separation of the mirrors defining the actual shape of the mirror edges must then be adapted to the kidney-shape of the respective footprint to be reflected in order to avoid vignetting.

It is worth to note that in embodiments where two mirrors on either side of the optical axis share a common surface of curvature on a common mirror substrate, the footprints of the associated reflexions, e.g. reflexions on mirrors M2 and M4 on the object-side, may overlap without causing vignetting of the beam.

As pointed out above it has been found beneficial for obtaining a small design object field radius when the footprints of the projection beam on a surface of curvature defined by a curved mirror are dimensioned such that they may be arranged in an interleaved or nestled manner. For example, the kidney-shape footprints of the reflections at M2 and M4 are nestled around the central footprints representing the transit of the projection beam through the curvature surface defined by mirrors M2 and M4 at the mirror group entry MGI. Also, the different dimensions of the reflection footprints at M2 and M4 allow nestling of the footprints into each other, preferably to an extent where lateral edge regions of the footprints overlap the cross-meridional plane CMP.

It is worth to note that the dimensions of the footprints close to the intermediate images are predominantly determined by the chief ray height CRH of the projection beam at the respective position within the optical system. For example, if the chief ray height corresponding to a reflection and the chief ray height corresponding to a geometrically close transmission are equal, but with opposite sign, then the lateral edges of the footprints are directly opposed to each other such that lateral edges cannot extend beyond the cross-meridional plane. Under these conditions, a minimum size of the arc shaped effective object field as schematically illustrated in FIG. 2(d) is generally not possible.

In a system where the footprints to be observed are in the region of optically conjugated intermediate images, then the footprints to be compared would represent essentially sharp images of the object field. In this case, the ratio of the chief ray heights at the respective footprints would essentially correspond to the magnification ratio between the intermediate images. If the magnification ratio would be significantly different from unity, then footprints with significantly different dimension could be obtained, which would allow to interleave the footprints into each other essentially as shown in FIGS. 4(b) and (c). However, if the critical surface for with the size of the footprints is to be determined lies significantly outside an intermediate image, then the size of a footprint will also be influenced by the marginal ray height at the respective positions, which essentially indicates the amount of defocus or the optical distance to the next intermediate image. In that case, too, a significant difference in chief ray height appears to be a prerequisite for obtaining footprints with significantly different dimensions allowing an interleaved arrangement similar to that of FIGS. 4(b) and (c).

In FIG. 5 representative examples of footprints in a predefined curvature surface of a concave mirror of the mirror group are shown to demonstrate the relationship between the chief ray height ratio $R_{CRH}=CRH_1/CRH_2$ between a first chief ray height in a reflecting first area and a second chief ray height $CRH_2$ of the same chief ray in an associated second area (reflecting or transmitting) and the relative sizes of the footprints. The incident positions of the chief ray CR are indicated as $CR_1$ and $CR_2$, respectively in (c). In each case, the effective object field is generally shaped and positioned in accordance with FIG. 2(d) (edges overlap the cross-meridional plane CMP) to allow γ near 1 or γ=1 for an extreme ring field. The footprints are formed by several individual field points showing the chief ray for each field point (dot) surrounded by a circle indicating the defocus due to the fact that the surface observed is not exactly in the surface defined by the intermediate image.

If $R_{CRH}=1$ (see (a)) then the footprints have essentially the same size, which leads to footprint overlap at the lateral edge regions. Beam vignetting occurs unless the both footprints correspond to reflections on the same mirror surface of a mirror pair. Footprint overlap still occurs at $R_{CRH}=1,3$ (see (b)). In (c) the size of the lower footprint in the second area is further reduced as the chief ray height ratio increases to about $R_{CRH}=1,6$. It is evident that no overlap occurs and a sufficient freeboard (lateral distance) between the interleaved footprints is obtained, such that an imaging free of vignetting is possible. The freeboard and size difference increase as the chief ray height ratio increases, e.g. to about $R_{CRH}=8,0$ in (e). If the mirror surface is allowed to be placed closer to an intermediate image and/or if the length A of the effective object field is chosen smaller than in the discussed embodiment, a separation of the footprints can be obtained for even smaller values for $R_{CRH}$, for example $R_{CRH}=1,4$.

Therefore, if the projection beam generates a footprint of a predetermined size in a reflecting first area of a curved mirror of the mirror group represented by a first chief ray height $CRH_1$, and the projection beam is incident on the same curvature surface in a second area off-set to the first reflecting area either in transmission or in reflection, then the second chief ray height $CRH_2$ corresponding to the chief ray height within the second area should be significantly different from the first chief ray height in the reflecting first area to allow close proximity of the respective footprints without causing vignetting. The difference in chief ray heights must be obtained for all curved mirrors of the design. Preferably, the conditions:

$$|R_{CRH}|<1/\alpha \text{ or } |R_{CRH}|>\alpha$$

and $$\alpha=1,4$$

should be fulfilled for a chief ray height ratio $R_{CRH}=CRH_1/CRH_2$ between a first chief ray height in the reflecting first area and a second chief ray height $CRH_2$ in the associated second area. The second area may be a transmission area where the projection beam transits a curvature surface defined by the curved mirror where the first reflection occurs. It is also possible that the second area is associated with a reflecting area of another curved mirror of the mirror group having a mirror surface close to the surface of curvature defined by the curved mirror where the first reflection occurs. Preferably, $\alpha \geq 1,6$, more preferably $\alpha \geq 1,8$, even more preferably $\alpha \geq 2,0$. In the embodiment of FIG. 3, $\alpha=2,92$ determined on the image-side between the exiting beam at TO and the reflection at the third mirror (R3).

Figure 4A:
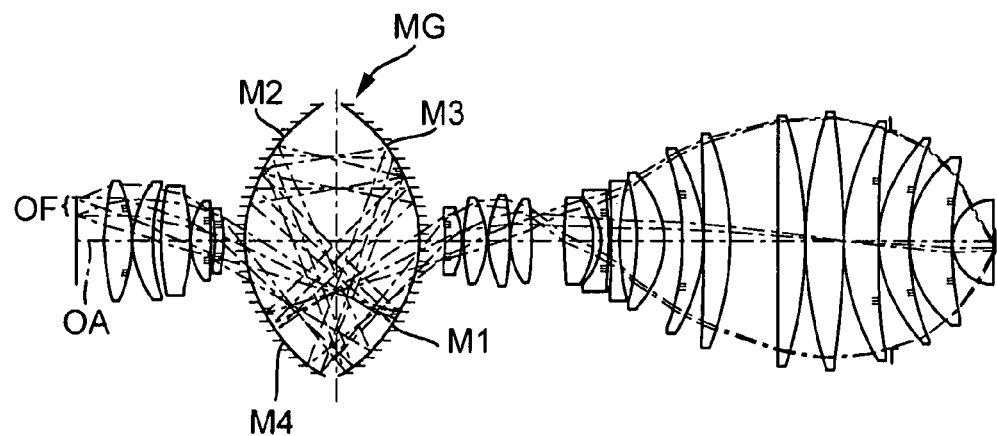
FIG. 4 shows another representation of the projection objective of FIG. 3 in (a) and the shapes and positions of footprints of the projection beam in the region of the image-side mirrors M2, M4 in (b) and on the object-side mirrors M1, M3 in (c)
Figures 4B, 4C:
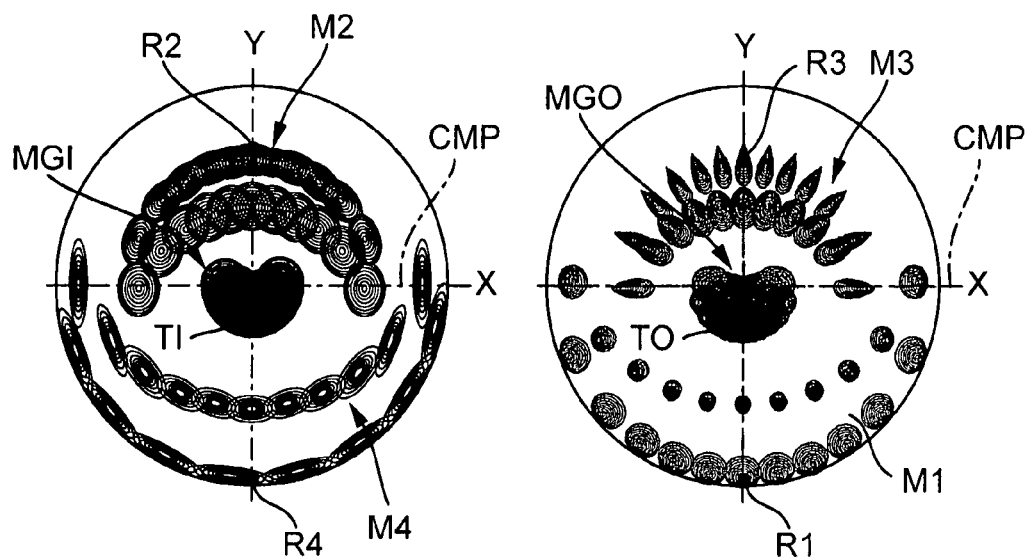
Figure 5A:
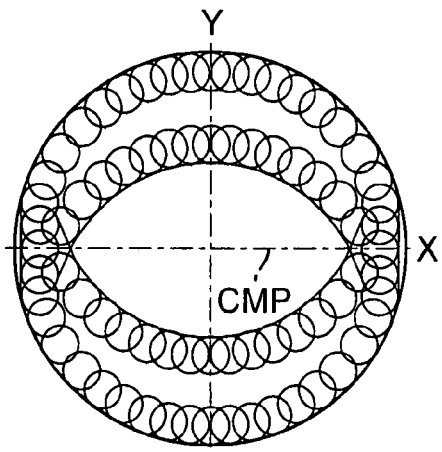
FIG. 5 shows representative examples of footprints in a predefined curvature surface of a concave mirror of a mirror group for various chief ray height ratios $R_{CRH}$.
Figure 5B:
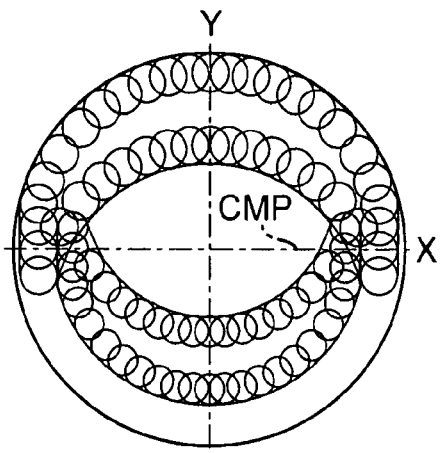
Figure 5C:
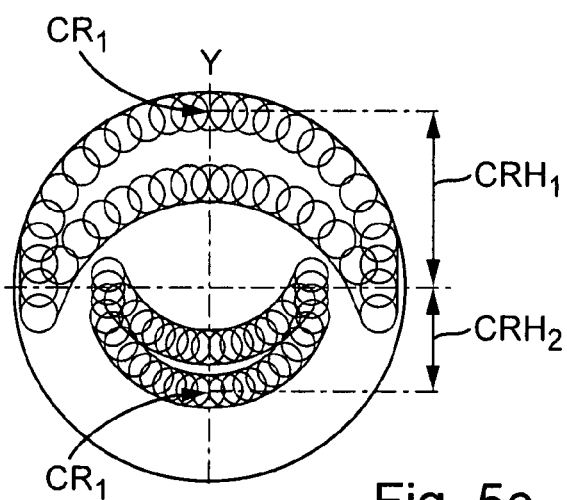
Figure 5D:
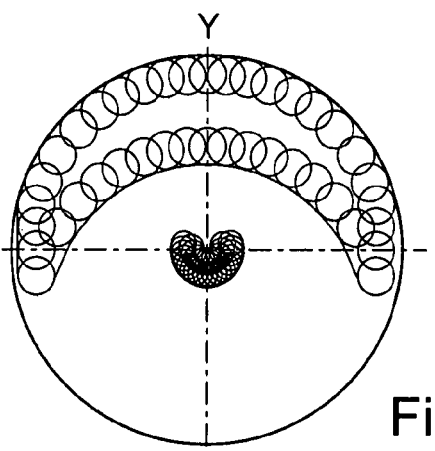
Figure 7A:
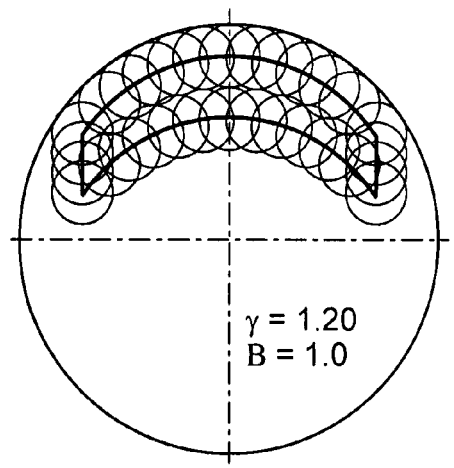
FIG. 7 illustrates schematically various shapes of footprints of an effective object field as a function of the bending B=b/a of the effective object field and of the etendue ratio $\gamma = R_{DOF}/R_{EOF}$
Figure 7B:
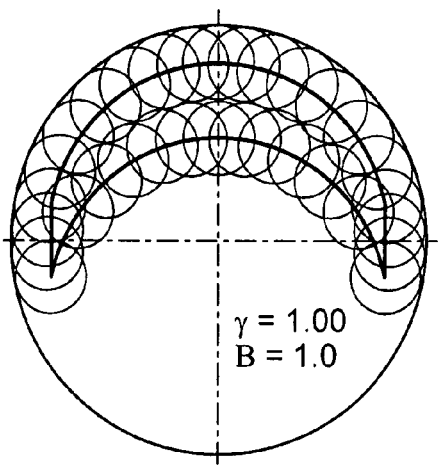
Figure 7C:
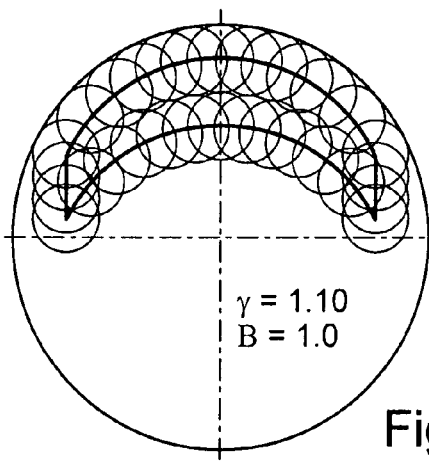
Figure 7D:
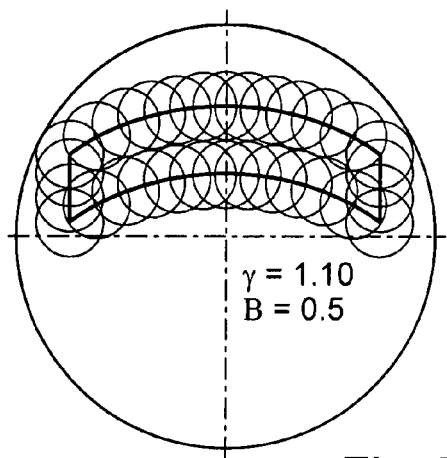
Figure 7E:
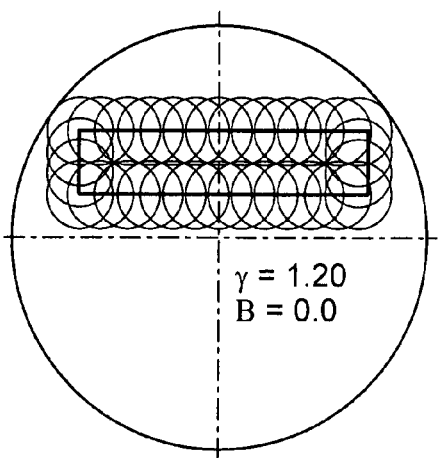

In the embodiment of FIGS. 3 and 4 it is evident that the footprints representing the reflections in the vicinity of respective field surfaces of the projection objective (intermediate images) are significantly spaced apart from each other. Likewise, a significant lateral distance exists between the central footprint (pupil footprint) and the neighbouring field-footprints (corresponding to reflections). This is schematically shown in FIG. 6(a), which is a schematic representation of the footprints shown in FIG. 4(b). Under these conditions, the size of the ring field can be increased, e.g. by increasing the length A by 10% or 20% or 30%. In this case, a larger effective objective field could be obtained, thereby improving the productivity of manufacturing processes.

It is also possible to decrease the curvature (or bending) of the arcuate field (e.g. by increasing the edge radius of the inner and outer edge of the field). This is demonstrated schematically in FIGS. 6(b) and (c). As shown in FIG. 6(c) the curvature or "bending" B of the arcuate field may be parameterized by B=b/a, where a is the radial distance between a secant through the points of contact between the effective object field and the edge of the design object field DOF, and b is the radial distance between that secant and the outer edge of the effective object field. Here, B=0 for a rectangular effective object field and B=1 for an effective object field having an outer edge curved like the corresponding design object field. Where 0<B<1 the footprints in a meridional section are moved closer together while the field points at the lateral edges of the field (in X-direction) remain essentially unchanged. Using a flattened ring field of this type may be utilized to decrease the overscan and may allow to use a simpler illumination system.

FIG. 7 illustrates schematically the shapes of footprints in a curvature surface of a concave mirror for various values of the bending parameter B and etendue ratio γ for arc shaped effective object fields in (a) to (c) and, for comparison, for a rectangular effective object field with b=0 in (e).

Figure 8:
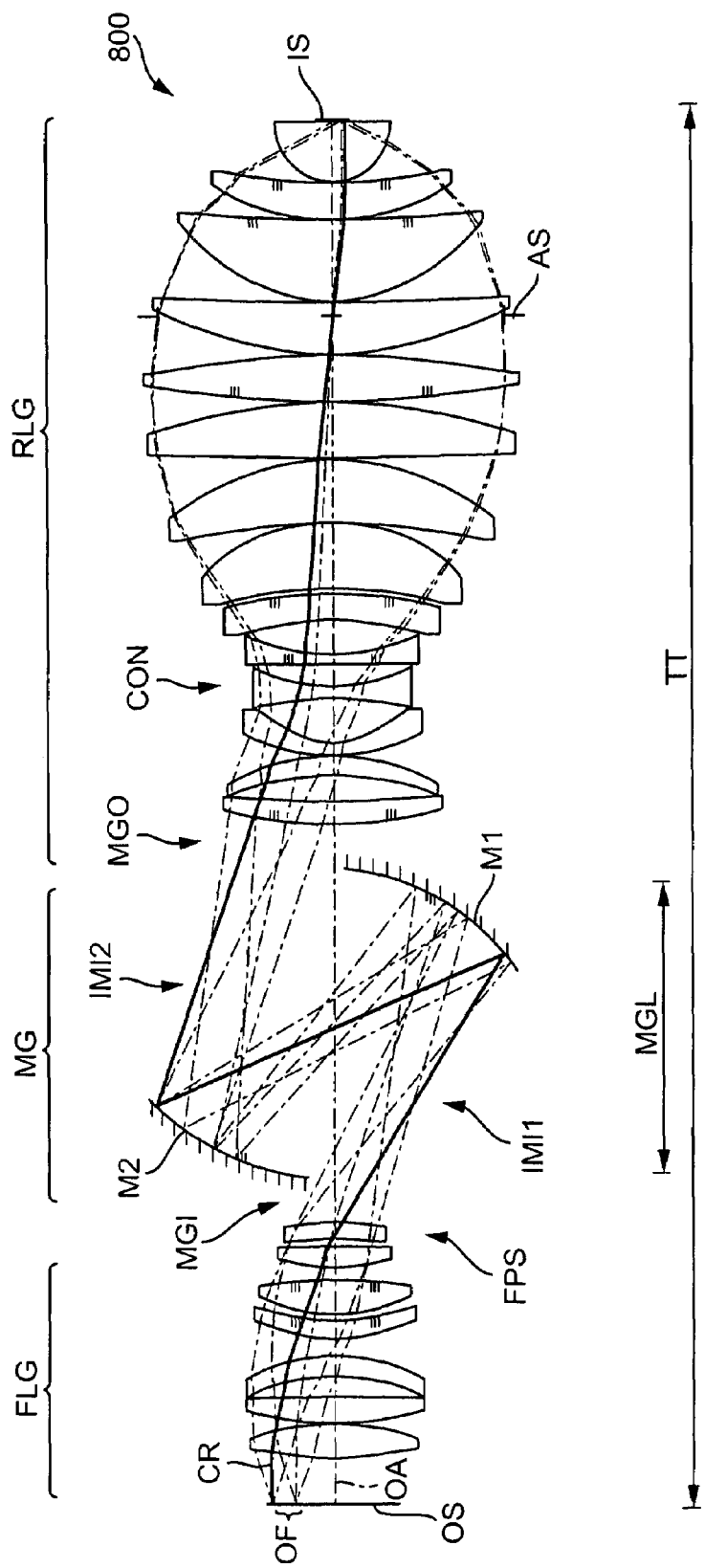
FIG. 8 shows a meridional section through another embodiment of a catadioptric in-line projection objective having a mirror group with exactly two concave mirrors facing each other.

FIG. 8 shows a projection objective 800 having a mirror group MG with just two concave mirrors facing each other and placed on opposite sides of the optical axis. The specification is given in tables 8, 8A. The projection objective has a front lens group FLG acting as an imaging subsystem to form a first intermediate image IMI1. A second, catoptric subsystem is formed by the mirror group MG and designed to form a second intermediate image IMI2 from the first intermediate image. A rear lens group RLG is designed as an imaging subsystem to image the second intermediate image on a reduced scale onto the image surface IS. The mirror MG consists of a first concave mirror M1 having a continuous (unbroken) mirror surface facing the object side, and a second concave mirror M2 having a continuous mirror surface facing the image side. A mirror group entry MGI is defined in the region where the curvature surface defined by the second mirror M2 intersects the optical axis OA, whereas a mirror group exit MGO is defined where the surface of curvature of the first mirror M1 intersects the optical axis. Both intermediate images (at least the paraxial part thereof) are positioned within an intermirror space defined by the concave mirrors.

Both mirrors are optically near an intermediate image, i.e. optically remote from a pupil surface. The mirror group entry is positioned geometrically in an intermediate region between a front pupil surface FPS near the exit lens of the front lens group FLG and the first intermediate image. The mirror group exit MGO is optically near the second intermediate image and optically remote from a rear pupil surface RPS where the aperture stop AS is placed.

The refractive imaging subsystem RLG serving to image the second intermediate image IMI2 on a strongly reduced scale onto the image surface IS has negative refractive power provided by three negative lenses with small diameter near the region of the constriction CON. These lenses contribute to Petzval sum correction.

The embodiment of FIG. 8 is a variant of a two-mirror in-line catadioptric projection objective having a basic design as disclosed in U.S. provisional application with Ser. No. 60/536,248 filed on Jan. 14, 2004 by the applicant or of systems disclosed in US provisional application titled "Catadioptric projection objective" field on Feb. 23, 2005 by the applicant. The disclosures of these documents is incorporated herein by reference.

Figure 9B:
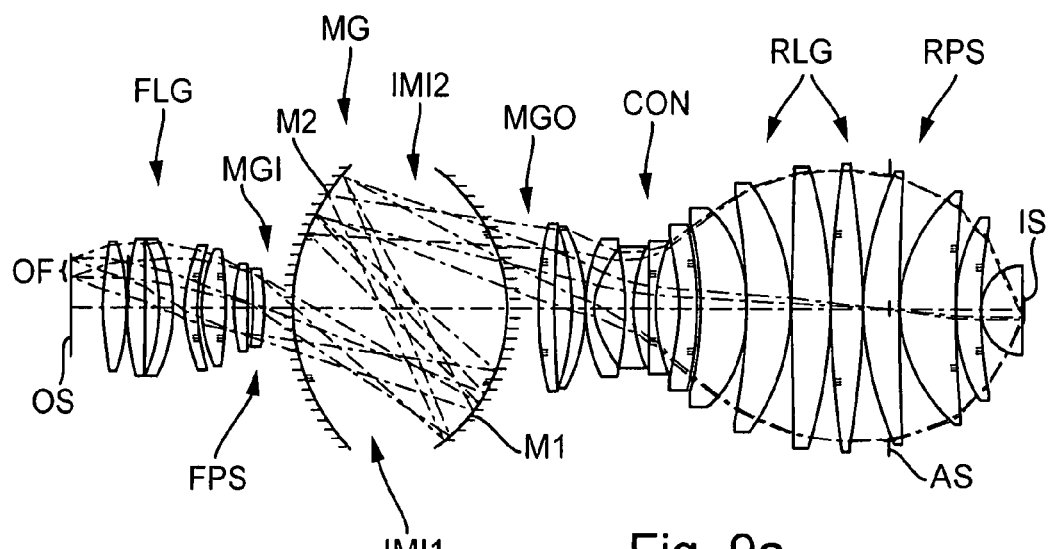
FIG. 9 shows another representation of the projection objective of FIG. 8 in (a) and the shapes and positions of footprints of the projection beam in the vicinity of the image-side first mirror in (b) and the object-side second mirror in (c)
Figure 9C:
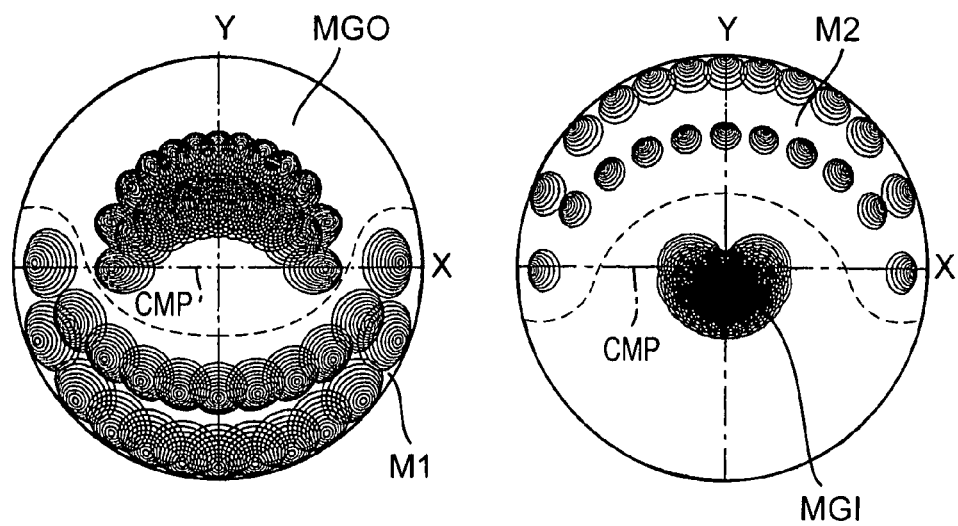

Specific properties of the projection beam transitting the projection objective between the arcuate object field OF and the demagnified image field are now explained with reference to FIG. 9. In (a) the system of FIG. 8 is shown with the surfaces of curvature of the object side mirror M2 and the image side mirror M1 extended across the optical axis to demonstrate the position of the reflecting areas on the mirrors as well as of the corresponding transmission areas where the projection beam passes the edges of the mirrors. In FIG. 9(b) the footprints on the exit side at mirror M1 are shown, FIG. 9(c) represents the footprints on the entry side. The small diameter of the beam cross section at the mirror group entry MGI and the shape being a compromise between a kidney-shape to be expected close to a field surface and a circular shape close to a pupil surface indicates the position of the mirror group entry intermediately between the front pupil surface FPS and the first intermediate image IMI1. In contrast, the curved shape of the reflection at M2 being similar to the shape of the effective object field (FIG. 2(d)) indicates optical proximity between the reflection at M2 and the second intermediate image. The situation is different on the exit side shown in (b). Here, the reflection at M1 occurs optically close to a field surface, indicated by the ring-shape of the footprint. As opposed to the entry side, the beam cross section close to the mirror group exit MGO is also shaped very similar to the shape of the object field indicating that the mirror group exit MGO is optically close to a field surface at the second intermediate image IMI2 and optically remote from the next pupil surface RPS where the aperture stop AS is positioned.

It is evident from FIGS. 9(b) and (c) that no overlap occurs between the reflections at mirrors M1 and M2 and the geometrically closest transitions of the projection beam through the respective curvature surface of the mirrors, whereby vignetting is avoided. Also, the lateral edge regions of the reflection footprints at M1 and M2 extend beyond the cross-meridial plane CMP indicating that the corresponding object field has the similar property, as shown in FIG. 2(d). Regarding the chief ray height ratio between the corresponding footprints at reflection and transmission a value $\alpha=1,67$ is obtained on the image-side of the mirror group indicating that the chief ray heights at reflection and corresponding transmission differs significantly enough to allow projection without vignetting at a small design object field radius. A possible shape of the edges of the mirrors M1 and M2 facing the optical axis are given in dashed lines in FIGS. 9(b) and (c). It is evident that the lateral mirror edges (in X-direction) are allowed to extend the cross-meridial plane CNP without causing beam vignetting. Again, the footprints are interleaved, made possible by the significant size difference of the footprints for reflection (large) and the corresponding footprints for transmission (smaller). Here, a design object field radius $R_{DOF}$=56 mm is obtained for a ring field having B=26 mm and A=5,5 mm. With $R_{EOF}$=53,15 this corresponds to an etendue ratio γ=1,05.

In the schematic FIG. 10 a further characteristic property of preferred embodiments suitable for projecting arcuate fields at very small design object field radius is shown. FIG. 10(a) shows an axial view on the object surface. The hatched region OC represents an optical channel defined by the collectivity of all object field points which can be imaged by the system without vignetting at a given image side numerical aperture NA=1,35. It is evident that this particular optical channel is capable of imaging field points from either side of the cross-meridianal plane CMP in the lateral edge regions along the cross-scan X-direction. FIGS. (b) and (c) represent the respective footprints in the region of the image side mirror M1(b) and the object side mirror M2(c). From these figures it is evident that no overlap occurs between the transmitted beam (at MGO or MGI) and the reflected beam (at the mirrors M1 or M2) even for field points at the outer edge of the optical channel OC.

Based on the design of FIG. 8 the following considerations may serve to further explain characteristic properties of preferred embodiments. Assuming that the object would be imaged into the intermediate images stigmatically without distortion, then the footprints on the mirrors would be similar in shape with modification only due to the defocus of the field points. In this case, the shape of a footprint can be estimated by the chief ray height and the marginal ray height at the respective position. To further simplify the representation, it is assumed in the following figures that the outermost field points at the lateral edges in X-direction are positioned on the cross-meridional plane CMP (as explained above, a decrease in the size of the design object field can be obtained if the lateral edges overlap the cross-meridional plane).

The footprints can essentially assume one of three configurations explained in the following in connection with FIGS. 11 and 12. In FIG. 11 it is shown how the footprint near a field surface (kidney-shape) and the footprint near a pupil surface (circular shape including the optical axis) may be positioned. The critical position with respect to vignetting is in the region of the meridional section (Y-Z-plane) where a finite distance d should be present between the footprints. The critical position can be controlled by defining the courses of the coma rays appropriately. A small pupil, i.e. a small marginal ray height $y_2$ as well as small marginal ray heights $y_1$ of the field footprints are beneficial for avoiding vignetting.

As explained in connection with FIG. 2(d) a minimum radius of the design object field can be obtained with an annular effective object field if the edges of the object field extend across the cross-meridional plane. In this case, each footprint in a position close to a field surface optically conjugate to the object surface will also extend across the cross-meridional plane. Therefore, if the reflection and the geometrically close transmission occur close to field surfaces (as shown e.g. in FIG. 9(b) and FIG. 12) then the footprints should have different dimensions to allow interleaving the footprints. FIG. 12 represents a case where the footprints are positioned on opposite sides of the optical axis OA. Another case (not shown) corresponds to embodiments where the corresponding intermediate images are positioned on the same side of the optical axis. In this case, control of the coma rays will enable an imaging free of vignetting.

In the case depicted in FIG. 12 it is required that the lateral distance d between the smaller inner footprint and the larger outer footprint in X-direction should exceed a lower limit $d_0$ according to $$d=(|Y_1|-|y_1|)-(|Y_2|+|y_2|)>d_0$$

where $Y_i$ are the chief ray heights and $y_i$ are the marginal ray heights at the respective positions. A value $d_0>0$ corresponds to the freeboard between the footprints. In this simplified approach it is assumed that the chief ray of the edge of the object field coincides with the chief ray at the edge of the effective object field. This limiting case is possible only in a minimal configuration schematically shown in FIG. 2(d) with minimum design etendue. In a more realistic approach, the minimum distance between the footprints will be influenced by beam bundles emanating from skew field points of the ring field, from the amount of aberrations of the intermediate images, from the shape of the ring field etc. However, an estimation of the lateral distance d according to the above condition is a good approximation.

Now reference is made to the case of FIG. 12 where two footprints close to optically conjugated field surfaces are be interleaved to allow minimizing the design object field radius. This is possible if:

$$|Y_1|>|Y_2|$$

where $y_1$ and $y_2$ are small.

It is to be emphasized that the marginal ray heights should be small at all positions critical to vignetting. Therefore, the following conditions should be fulfilled for a catadioptric in-line projection objective $$\frac{|y_i|}{a_{ij}} \le A, \frac{|y_j|}{a_{ij}} < C$$

and $$\frac{|Y_i|-|Y_j|}{a_{ij}} < D$$

where index i corresponds to reflecting surfaces and index j corresponds to associated pseudo surfaces (reflection at or transmission throughon the curvature surface defined by a curved mirror. Here, $y_i$ is the marginal ray high on a mirror surface and $y_j$ is a marginal ray high on a corresponding transmission position, $Y_i$ and $Y_j$ are the respective chief ray heights, $a_{ij}$ is the maximum value of the optically free diameter of the mirror surface and the corresponding pseudo surface and C and D are constants. The first relation indicates that the footprints of the single field points should be as small as possible. Particularly, a small pupil is beneficial for avoiding vignetting at high numerical apertures. If the second condition is fulfilled, the footprints can be interleaved as shown in FIG. 12, for example. If this condition is fulfilled, the design etendue value can be lowered with respect to prior art projection objectives. It appears that C=0,5 or 0,3 or 0,2 and/or D=0,5 or 0,3 or 0,2 will be beneficial to obtain vignetting free projection.

Figure 13:
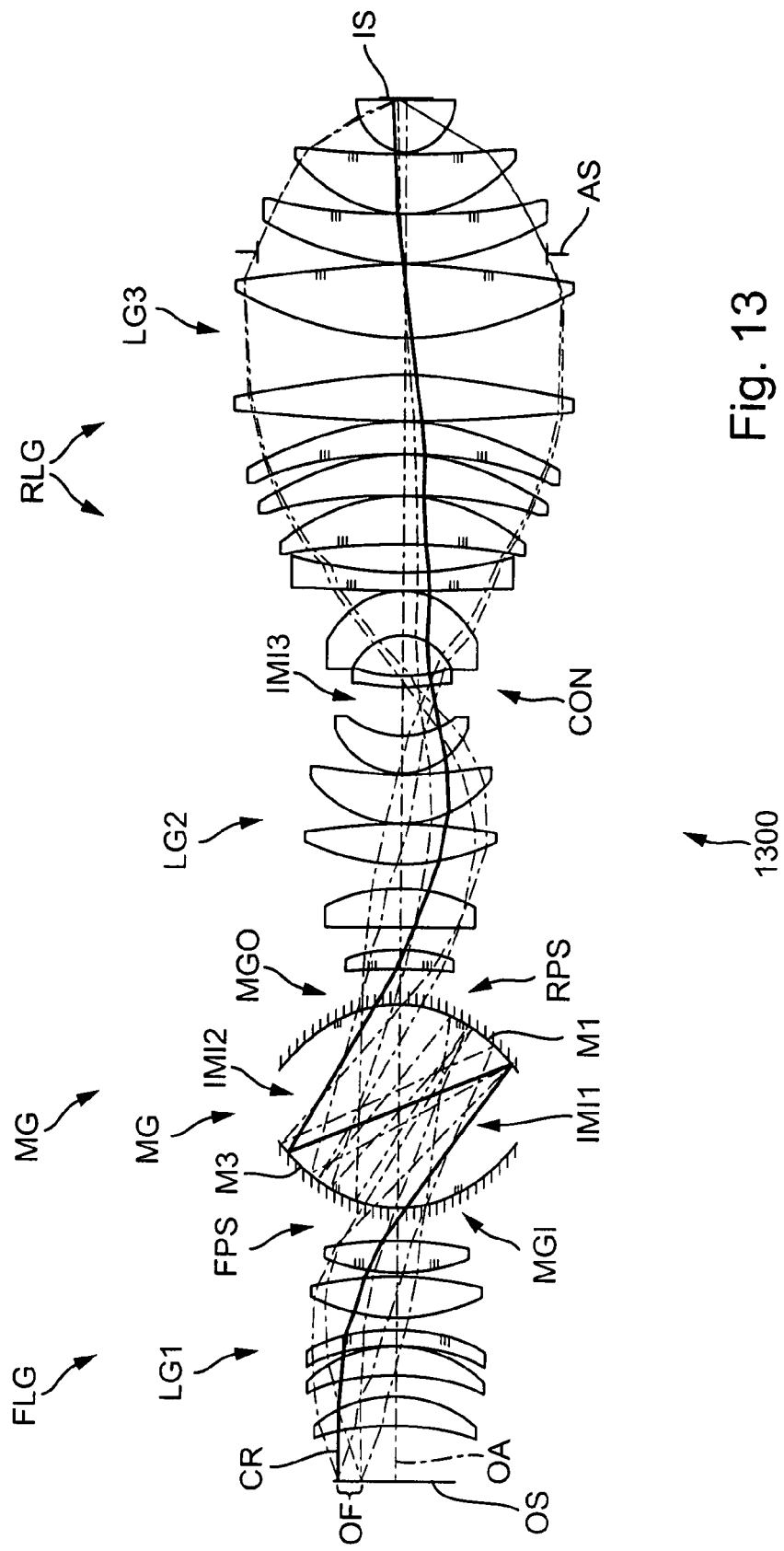
FIG. 13 shows a meridional section through another embodiment of a catadioptric in-line projection objective having a mirror group with exactly two concave mirrors facing each other.

FIG. 13 shows an embodiment of a projection objective 1300 having a mirror group with just two concave mirrors on opposite sides of the optical axis and three intermediate images. The specification is given in tables 13, 13A. The projection objective has a first lens group LG1 acting as an imaging subsystem to form a first intermediate image IMI1. A second, catoptric subsystem is formed by a mirror group MG and designed to form a second intermediate image IMI2 from the first intermediate. A second lens group LG2 is designed as an imaging subsystem to form a third intermediate image IMI3 from the second intermediate image in a constriction region CON of the rear lens group RLG following the mirror group. A third lens group LG3 with positive refractive power serves to image the intermediate image on a reduced scale onto the image surface IS. The mirror MG consists of a first concave mirror M1 having a mirror surface facing the object side, and a second concave mirror M2 on the other side of the optical axis having a mirror surface facing the image side. A mirror group entry MGI is defined in the region where the curvature surface defined by the second mirror intersects the optical axis OA, whereas a mirror group exit MGO is defined where the surface of curvature of the first mirror M1 intersects the optical axis. Both intermediate images (at least the paraxial part thereof) are positioned within an intermirror space defined by the concave mirrors. Both mirrors are arranged near an intermediate image, i.e. optically remote from a pupil surface. The mirror group entry is positioned geometrically in an intermediate region between a front pupil surface downstream of the exit lens of the first lens group LG1 and the first intermediate image. Likewise, the mirror group exit is positioned intermediately between the second intermediate image and the subsequent pupil surface RPS position in the entry section of the second lens group LG2.

It is a characterizing feature of this type of two-mirror in-line projection objective that the angle included between the chief ray CR and the optical axis (chief ray angle CRA) may be as high as 70° or 80° or more indicated by the fact that the radiation beam crosses the optical axis between the first and second mirror almost at right angles. This corresponds to a small beam cross section at this pupil surface. High values for the chief ray angle are also obtained upstream and downstream of the mirror group in the region of the first and second intermediate images, respectively. Here, the design object field radius ($R_{DOF}$=54 mm) is almost identical to $R_{EOF}$=53, 15 for a ring field having B=26 mm and A=5,5 mm, therefore the etendue ratio $\gamma \approx 1$.

When compared to the embodiment of FIG. 8 it is evident that the concave mirrors M1 and M2 have stronger curvature leading to a stronger effect on Petzval sum correction. Also, the chief ray angle is larger in the region of the mirror group exit downstream of the second intermediate image, leading to a smaller beam cross-section in this region, which is closer to a pupil surface. The additional intermediate image IMI3 within the rear lens group RLG is freely accessible and allows to arrange a field stop, if desired.

It is evident from the above discussion that the sizes and shapes of the footprints are influenced by the imaging aberrations. Therefore, a specific controlling of the imaging abberrations may improve the capability of the design to accommodate interleaved footprints. For example, the design can be optimized to allow internal coma (chief ray closer to the optical axis than the center of gravity of the spot) for the smaller footprints and external coma for the larger footprints. Also, proximity to tangential field plane of the intermediate image may be beneficial for each foot print close to a field surface. Also, pincushion (or positive) distortion may be beneficial for the larger footprint, whereas barrel (negative) distortion may be beneficial for the smaller footprint. If these aberrations are applied to the imaging within the mirror group, values for $\alpha$ as small as $\alpha$=1,4 or even smaller may be obtained.

The principles of the invention have been explained using high-NA catadioptric projection objectives designed for immersion lithography at NA>1. The invention can also be utilized in "dry systems", i.e. in catadioptric projection objectives with NA<1 having an image side working distance which is filled with a gas during operation.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

TABLE 3

(k42)

| SURFACE | RADIUS | THICKNESS | MATERIAL | INDEX | SEMIDIAM. |
|---|---|---|---|---|---|
| 0 | 0.000000 | 39.992453 | | | 56.0 |
| 1 | 287.262401 | 36.416614 | SILUV | 1.560491 | 73.8 |
| 2 | −248.845556 | 0.994360 | | | 75.2 |
| 3 | 124.466113 | 26.260130 | SILUV | 1.560491 | 73.0 |
| 4 | 263.246412 | 10.714029 | | | 69.6 |
| 5 | 352.132678 | 38.987756 | SILUV | 1.560491 | 67.4 |
| 6 | −273.408193 | 0.998400 | | | 60.9 |
| 7 | 93.362144 | 25.717987 | SILUV | 1.560491 | 47.7 |
| 8 | −435.680384 | 6.461367 | | | 40.3 |
| 9 | −200.769760 | 11.409723 | SILUV | 1.560491 | 36.4 |
| 10 | −179.043003 | 267.379504 | | | 32.9 |
| 11 | −183.843209 | −237.389045 | REFL | | 172.2 |
| 12 | 187.695527 | 237.389045 | REFL | | 123.4 |
| 13 | −183.843209 | −237.389045 | REFL | | 121.6 |
| 14 | 187.695527 | 274.574729 | REFL | | 175.1 |
| 15 | 4087.186611 | 22.896377 | SILUV | 1.560491 | 31.6 |
| 16 | −109.651105 | 3.192151 | | | 38.5 |
| 17 | 213.175889 | 31.765118 | SILUV | 1.560491 | 48.8 |
| 18 | −103.856711 | 0.987128 | | | 52.3 |
| 19 | 128.616108 | 29.623257 | SILUV | 1.560491 | 56.1 |
| 20 | −323.431478 | 0.993905 | | | 55.1 |

TABLE 3-continued (k42)

| SURFACE | RADIUS | THICKNESS | MATERIAL | INDEX | SEMIDIAM. |
|---|---|---|---|---|---|
| 21 | 102.556421 | 28.633106 | SILUV | 1.560491 | 50.5 |
| 22 | −319.774976 | 44.978959 | | | 46.2 |
| 23 | 711.709873 | 39.113711 | SILUV | 1.560491 | 48.6 |
| 24 | −105.498857 | 10.386558 | | | 53.5 |
| 25 | −78.928705 | 10.170389 | SILUV | 1.560491 | 53.6 |
| 26 | −275.331705 | 4.278169 | | | 62.5 |
| 27 | −663.197815 | 9.992578 | SILUV | 1.560491 | 64.7 |
| 28 | 285.677243 | 23.879980 | | | 72.9 |
| 29 | −294.029160 | 36.680250 | SILUV | 1.560491 | 77.4 |
| 30 | −123.117255 | 25.037122 | | | 86.0 |
| 31 | −422.007649 | 27.641800 | SILUV | 1.560491 | 110.4 |
| 32 | −214.646011 | 0.994276 | | | 116.8 |
| 33 | −2320.188497 | 34.997888 | SILUV | 1.560491 | 131.8 |
| 34 | −356.242551 | 65.148209 | | | 135.4 |
| 35 | 35285.400373 | 37.185149 | SILUV | 1.560491 | 158.7 |
| 36 | −531.263790 | 0.990798 | | | 160.5 |
| 37 | 554.479388 | 49.699960 | SILUV | 1.560491 | 164.0 |
| 38 | −1039.967270 | 0.982385 | | | 163.2 |
| 39 | 298.441878 | 45.761922 | SILUV | 1.560491 | 152.1 |
| 40 | 2799.315277 | 18.750574 | | | 148.2 |
| 41 | 0.000000 | −17.773345 | | | 143.4 |
| 42 | 188.720833 | 40.930543 | SILUV | 1.560491 | 132.0 |
| 43 | 474.044327 | 1.000000 | | | 126.8 |
| 44 | 133.978207 | 61.433133 | SILUV | 1.560491 | 107.7 |
| 45 | 1121.234888 | 1.000000 | | | 95.7 |
| 46 | 57.234157 | 53.155843 | SILUV | 1.560491 | 53.0 |
| 47 | 0.000000 | 3.000000 | WATER | 1.430000 | 22.7 |
| 48 | 0.000000 | 0.000000 | | | 14.0 |

TABLE 3A

Aspheric Constants

| | SURFACE | | | | | |
|---|---|---|---|---|---|---|
| | 2 | 8 | 10 | 11, 13 | 12, 14 | 15 |
| K | 0 | 0 | 0 | −0.212687 | −0.215149 | 0 |
| C1 | −1.416673E−07 | 5.298342E−07 | 1.697958E−07 | 3.329345E−10 | −7.630291E−10 | −6.834626E−07 |
| C2 | 9.599761E−13 | −5.377334E−11 | 5.775840E−12 | 1.122335E−14 | 4.963086E−14 | 8.151407E−11 |
| C3 | 1.203859E−15 | 1.659395E−14 | −9.809143E−15 | 5.343189E−20 | −4.418186E−18 | −2.527564E−14 |
| C4 | 5.550275E−21 | −1.703261E−18 | −8.154768E−19 | −3.868210E−24 | 1.322805E−22 | 7.081708E−19 |
| C5 | −2.121542E−24 | −1.085689E−22 | 5.434604E−23 | 1.322546E−29 | −1.853232E−27 | −3.199574E−23 |

| | SURFACE | | | | |
|---|---|---|---|---|---|
| | 26 | 31 | 40 | 43 | 45 |
| K | 0 | 0 | 0 | 0 | 0 |
| C1 | 3.335939E−07 | −3.366739E−08 | 8.091876E−09 | 3.326077E−08 | 3.307620E−08 |
| C2 | −5.921226E−12 | 7.684888E−13 | −7.282660E−14 | −4.651032E−13 | 9.019930E−13 |
| C3 | −3.172647E−15 | −2.120859E−17 | 1.339592E−17 | −3.073377E−17 | 8.352416E−18 |
| C4 | 4.011262E−19 | 8.250262E−22 | −6.368560E−22 | 1.035245E−21 | −3.589756E−21 |
| C5 | −1.778640E−23 | −1.068236E−25 | 8.783547E−27 | −5.604595E−27 | 2.362242E−25 |

TABLE 8

(k48)

| SURFACE | RADIUS | THICKNESS | MATERIAL | INDEX | SEMIDIAM. |
|---|---|---|---|---|---|
| 0 | 0.000000 | 39.983913 | | | 56.0 |
| 1 | 414.154916 | 29.693947 | SILUV | 1.560491 | 72.7 |
| 2 | −251.443942 | 0.994537 | | | 74.5 |
| 3 | 302.619283 | 24.578375 | SILUV | 1.560491 | 75.8 |
| 4 | −965.765933 | 17.879083 | | | 75.2 |
| 5 | −174.202868 | 17.393341 | SILUV | 1.560491 | 74.7 |
| 6 | −159.966132 | 16.024333 | | | 76.0 |
| 7 | 173.487964 | 16.487084 | SILUV | 1.560491 | 67.7 |
| 8 | 207.745286 | 5.502741 | | | 64.6 |

TABLE 8-continued (k48)

| SURFACE | RADIUS | THICKNESS | MATERIAL | INDEX | SEMIDIAM. |
|---|---|---|---|---|---|
| 9 | 155.423324 | 28.281227 | SILUV | 1.560491 | 62.3 |
| 10 | −241.621912 | 13.747671 | | | 58.5 |
| 11 | 197.683110 | 18.371187 | SILUV | 1.560491 | 46.7 |
| 12 | −1125.629272 | 6.125509 | | | 41.8 |
| 13 | −398.907070 | 14.197301 | SILUV | 1.560491 | 38.6 |
| 14 | −277.207561 | 322.429579 | | | 40.6 |
| 15 | −192.027915 | −282.426918 | REFL | | 168.5 |
| 16 | 226.376561 | 323.427125 | REFL | | 164.3 |
| 17 | 586.705586 | 20.450734 | SILUV | 1.560491 | 95.9 |
| 18 | 1407.872088 | 24.101244 | | | 93.6 |
| 19 | −260.399403 | 17.717366 | SILUV | 1.560491 | 92.5 |
| 20 | −199.441632 | 1.404759 | | | 92.3 |
| 21 | 170.121542 | 10.138415 | SILUV | 1.560491 | 76.2 |
| 22 | 93.862430 | 42.567767 | | | 67.5 |
| 23 | −229.404315 | 9.998235 | SILUV | 1.560491 | 66.9 |
| 24 | 150.063202 | 19.491914 | | | 67.5 |
| 25 | 503.615657 | 9.995637 | SILUV | 1.560491 | 69.0 |
| 26 | 213.385648 | 29.110090 | | | 74.7 |
| 27 | −270.267873 | 25.327984 | SILUV | 1.560491 | 78.3 |
| 28 | −276.767060 | 4.421113 | | | 94.1 |
| 29 | −386.490510 | 59.151150 | SILUV | 1.560491 | 98.4 |
| 30 | −173.755650 | 0.998941 | | | 117.0 |
| 31 | −619.484694 | 58.303709 | SILUV | 1.560491 | 135.6 |
| 32 | −227.927796 | 0.999056 | | | 145.1 |
| 33 | 4379.630621 | 51.816051 | SILUV | 1.560491 | 160.2 |
| 34 | −480.324458 | 0.998911 | | | 163.3 |
| 35 | 850.544409 | 40.199485 | SILUV | 1.560491 | 165.0 |
| 36 | −825.437991 | 32.498755 | | | 164.9 |
| 37 | 0.000000 | −31.506491 | | | 158.1 |
| 38 | 351.180213 | 46.611201 | SILUV | 1.560491 | 157.9 |
| 39 | 4242.748414 | 1.000000 | | | 155.4 |
| 40 | 175.809642 | 73.296850 | SILUV | 1.560491 | 136.3 |
| 41 | −4956.221240 | 1.000000 | | | 129.4 |
| 42 | 224.958665 | 31.392011 | SILUV | 1.560491 | 105.3 |
| 43 | 1144.928068 | 1.000000 | | | 95.6 |
| 44 | 56.937617 | 51.828050 | SILUV | 1.560491 | 52.4 |
| 45 | 0.000000 | 3.000000 | WATER | 1.430000 | 22.4 |
| 46 | 0.000000 | 0.000000 | | | 14.0 |

TABLE 8A

Aspheric Constants

| | SURFACE | | | | |
|---|---|---|---|---|---|
| | 8 | 10 | 15 | 16 | 17 |
| K | 0 | 0 | −0.327385 | −0.385756 | 0 |
| C1 | −9.111079E−09 | 3.056444E−07 | −6.621878E−10 | 2.083380E−09 | 6.859017E−08 |
| C2 | −2.404920E−11 | 1.565332E−11 | −4.607284E−15 | 5.011209E−15 | −3.386127E−12 |
| C3 | 3.322000E−15 | −3.420157E−15 | −6.473032E−19 | 1.199726E−18 | 1.727284E−16 |
| C4 | −4.477158E−19 | 1.042424E−18 | 1.108993E−23 | −2.508362E−23 | −1.539260E−20 |
| C5 | 8.082527E−23 | −1.950099E−22 | −3.461838E−28 | 3.773652E−28 | 4.864804E−25 |

| | SURFACE | | | | |
|---|---|---|---|---|---|
| | 25 | 28 | 35 | 41 | 43 |
| K | 0 | 0 | 0 | 0 | 0 |
| C1 | −1.789368E−07 | 6.545399E−08 | −6.523291E−09 | 2.791725E−08 | 1.323479E−08 |
| C2 | −8.101285E−12 | −2.441464E−12 | −1.196568E−13 | −7.439764E−13 | 2.630285E−12 |
| C3 | 5.023064E−16 | −6.219885E−17 | 5.386390E−18 | 7.713298E−18 | −1.005323E−16 |
| C4 | 1.259088E−19 | 1.946218E−20 | −1.112692E−23 | 1.043881E−22 | 4.504573E−21 |
| C5 | 1.486355E−23 | 1.113058E−25 | −5.182350E−28 | −6.610517E−28 | 2.732991E−26 |

TABLE 13

(k79)

| SURF | RADIUS | THICKNESS | MATERIAL | INDEX | SEMIDIAM. |
|---|---|---|---|---|---|
| 0 | 0.000000 | 50.379960 | | | 54.0 |
| 1 | −230.398018 | 26.170919 | SILUV | 1.560491 | 68.4 |
| 2 | −119.256541 | 18.135418 | | | 72.5 |
| 3 | −205.394925 | 25.889075 | SILUV | 1.560491 | 76.2 |
| 4 | −123.432289 | 1.683502 | | | 79.0 |
| 5 | −175.951557 | 13.866624 | SILUV | 1.560491 | 77.8 |
| 6 | −150.627075 | 11.205056 | | | 79.2 |
| 7 | 178.277785 | 35.676055 | SILUV | 1.560491 | 75.9 |
| 8 | −402.815216 | 4.983559 | | | 73.3 |
| 9 | 149.859839 | 28.406091 | SILUV | 1.560491 | 62.2 |
| 10 | −363.431291 | 215.025819 | | | 57.2 |
| 11 | −123.203340 | −185.024962 | REFL | | 109.6 |
| 12 | 123.203340 | 215.991155 | REFL | | 107.2 |
| 13 | −548.062029 | 17.484459 | SILUV | 1.560491 | 41.0 |
| 14 | −150.642724 | 20.135829 | | | 46.0 |
| 15 | −1694.360406 | 35.720609 | SILUV | 1.560491 | 58.3 |
| 16 | −140.930182 | 22.758321 | | | 65.2 |
| 17 | 205.903990 | 36.336336 | SILUV | 1.560491 | 83.0 |
| 18 | −510.286226 | 1.226005 | | | 83.4 |
| 19 | 105.525606 | 45.180952 | SILUV | 1.560491 | 81.6 |
| 20 | 542.564539 | 2.657392 | | | 76.8 |
| 21 | 67.923301 | 33.384596 | SILUV | 1.560491 | 58.8 |
| 22 | 86.151059 | 44.357884 | | | 46.9 |
| 23 | 309.216144 | 9.996038 | SILUV | 1.560491 | 39.5 |
| 24 | 133.456208 | 36.483624 | | | 42.0 |
| 25 | −50.938283 | 40.452397 | SILUV | 1.560491 | 44.3 |
| 26 | −74.048559 | 0.998733 | | | 66.3 |
| 27 | 745.925108 | 15.463426 | SILUV | 1.560491 | 88.3 |
| 28 | 370.195362 | 25.079922 | | | 97.5 |
| 29 | −1354.693259 | 43.742398 | SILUV | 1.560491 | 101.5 |
| 30 | −170.103679 | 0.996820 | | | 109.3 |
| 31 | −466.186436 | 35.333374 | SILUV | 1.560491 | 122.7 |
| 32 | −225.954297 | 0.997685 | | | 128.0 |
| 33 | −479.438604 | 29.217675 | SILUV | 1.560491 | 133.4 |
| 34 | −249.518130 | 0.998828 | | | 137.8 |
| 35 | 1307.945539 | 40.972878 | SILUV | 1.560491 | 148.9 |
| 36 | −559.725724 | 34.522606 | | | 150.0 |
| 37 | 312.626967 | 66.393024 | SILUV | 1.560491 | 149.3 |
| 38 | −527.434482 | 6.632516 | | | 147.0 |
| 39 | 0.000000 | −5.635113 | | | 135.9 |
| 40 | 255.790078 | 42.984350 | SILUV | 1.560491 | 125.8 |
| 41 | 1079.279378 | 1.000000 | | | 117.0 |
| 42 | 131.485950 | 52.783187 | SILUV | 1.560491 | 97.9 |
| 43 | 18194.985265 | 1.000000 | | | 89.2 |
| 44 | 49.947167 | 44.956203 | SILUV | 1.560491 | 46.3 |
| 45 | 0.000000 | 3.000000 | WATER | 1.430000 | 22.3 |
| 46 | 0.000000 | 0.000000 | | | 13.5 |

TABLE 13A

Aspheric Constants

| | SURFACE | | | | | |
|---|---|---|---|---|---|---|
| | 6 | 9 | 11 | 11 | 13 | 27 |
| K | 0 | 0 | −0.241871 | −0.241871 | 0 | 0 |
| C1 | 3.090609E−08 | −1.243595E−07 | −2.966437E−09 | 2.966437E−09 | −1.418028E−07 | −8.299389E−08 |
| C2 | 5.939577E−12 | −3.448799E−12 | −7.160681E−14 | 7.160681E−14 | 2.222350E−12 | 3.475458E−13 |
| C3 | −4.233897E−16 | −7.663097E−16 | −1.488516E−18 | 1.488516E−18 | −2.557965E−16 | 2.059103E−16 |
| C4 | 6.239589E−20 | −3.219118E−20 | −1.918169E−22 | 1.918169E−22 | 5.215213E−20 | −5.318292E−21 |
| C5 | −3.087232E−24 | 1.378537E−23 | 6.528296E−27 | −6.528296E−27 | 1.363923E−23 | −4.847427E−25 |
| C6 | 1.428951E−28 | −4.582128E−28 | −2.514965E−31 | 2.514965E−31 | −6.639720E−27 | −1.143525E−29 |

| | SURFACE | | | | |
|---|---|---|---|---|---|
| | 29 | 33 | 38 | 41 | 43 |
| K | 0 | 0 | 0 | 0 | 0 |
| C1 | −4.747508E−08 | −2.849100E−08 | 1.876526E−08 | 2.087506E−08 | 4.345046E−08 |
| C2 | 1.702713E−12 | 9.091221E−13 | −5.083847E−13 | −7.288055E−13 | 3.542263E−13 |
| C3 | −1.005708E−16 | −9.292932E−18 | 2.356455E−17 | 5.977819E−17 | −1.904662E−16 |

TABLE 13A-continued

| | | Aspheric Constants | | | |
|---|---|---|---|---|---|
| C4 | −1.019780E−21 | 4.432955E−22 | −2.156287E−21 | −1.384305E−21 | 2.454764E−20 |
| C5 | 1.905050E−25 | −3.500712E−26 | 7.801854E−26 | 1.105339E−25 | −1.505323E−24 |
| C6 | 4.339499E−31 | −3.289541E−31 | −9.384109E−31 | −5.351937E−30 | 6.676183E−29 |

The invention claimed is:

1. A catadioptric projection objective for imaging an off-axis effective object field arranged in an object surface of the projection objective onto an off-axis effective image field arranged in an image surface of the projection objective comprising:
an optical axis;
an effective object field situated entirely outside the optical axis and having a length A in a first direction and a width B in a second direction perpendicular to the first direction such that a circular area of minimum size enclosing the effective object field defines a radius $R_{EOF}$ of the effective object field according to:

$$R_{EOF} = \sqrt{(A/2)^2 + (B/2)^2}\ ;$$

a circular design object field centered around the optical axis having a design object field radius $R_{DOF}$, where the projection objective is essentially corrected with respect to image aberrations in zones having radial coordinates smaller than $R_{DOF}$ and wherein the projection objective is not fully corrected in zones having radial coordinates larger than $R_{DOF}$, wherein the following conditions are fulfilled:

$$R_{DOF} = \gamma R_{EOF}$$

and $$1 \leq \gamma \leq 1.2.$$

2. Projection objective according to claim 1, wherein the effective object field is a ring field having an arcuate shape, where an inner edge of the effective object field facing the optical axis and an outer edge of the effective object field remote from the optical axis are aligned transverse the first direction and have the same arcuate shape, a translatory offset between the inner edge and the outer edge in the first direction defining the length A of the effective object field.

3. Projection objective according to claim 2, wherein the outer edge has a center of curvature on the optical axis and an edge radius is equal to the radius $R_{DOF}$ of the design object field.

4. Projection objective according to claim 2, wherein the ring field is dimensioned such that lateral edge regions of the effective object field in a width direction (second direction) perpendicular to the length direction overlap a cross-meridional plane through the optical axis and a center section of the inner edge has a radial distance from the optical axis.

5. Projection objective according to claim 1, wherein the effective object field has an aspect ratio AR=B/A between width B and length A and wherein the aspect ratio is in a range from 2:1 to 10:1.

6. Projection objective according to claim 1, wherein the projection objective has an even number of mirrors.

7. Projection objective according to claim 1, wherein the projection objective has an even number of curved mirrors, all curved mirrors being concave mirrors.

8. Projection objective according to claim 7, wherein the even number is one of two and four.

9. Projection objective according to claim 1, wherein the projection objective is an in-line system having one straight optical axis common to all optical elements.

10. Projection objective according to claim 1, further comprising:
least one mirror group having an object side mirror group entry, an image side mirror group exit, and a mirror group plane aligned transversly to the optical axis and arranged geometrically between the mirror group entry and the mirror group exit, the mirror group including:
a first mirror having a first mirror surface for receiving radiation coming from the mirror group entry in a first reflecting area;
at least one second mirror having a second mirror surface facing the first mirror surface for receiving radiation coming from the first mirror in a second reflecting area;
at least one of the first and second mirrors being a concave mirror having a concave mirror surface having a surface of curvature defining a mirror axis on the optical axis;
wherein the mirrors of the mirror group are arranged such that at least one intermediate image is positioned inside the mirror group between mirror group entry and mirror group exit, and that radiation coming from the mirror group entry passes at least four times through the mirror group plane and is reflected at least twice on a concave mirror surface of the mirror group prior to exiting the mirror group at the mirror group exit.

11. Projection objective according to claim 10, wherein the mirror group is a purely reflective (catoptric) mirror group.

12. Projection objective according to claim 10, wherein the mirror group includes a first mirror for receiving radiation from the mirror group entry on a first reflecting area; a second mirror for receiving radiation reflected from the first mirror on a second reflecting area; a third mirror for receiving radiation reflected from the second mirror on a third reflecting area; and a fourth mirror for receiving radiation reflected from the third mirror in a fourth reflecting area and for reflecting the radiation to the mirror group exit.

13. Projection objective according to claim 12, wherein the first, second, third and fourth mirror is a concave mirror.

14. Projection objective according to claim 10, wherein the mirror group includes at least one mirror pair consisting of two concave mirrors having mirror surfaces sharing a common surface of curvature provided on a common mirror substrate having a transmissive portion provided between the concave mirrors of the mirror pair.

15. Projection objective according to claim 14, wherein the transmissive portion includes the optical axis.

16. Projection objective according to claim 14, wherein the transmissive portion is formed by a hole in a mirror substrate.

17. Projection objective according to claim 1, further comprising at least one mirror group having an object side mirror group entry and an image side mirror group exit, wherein a length ratio LR between an axial mirror group length MGL and a total track length TT of the projection objective is less than 50%, where the mirror group length is the axial distance between a mirror vertex closest to the object surface and a mirror vertex closest to the image surface and the total track length is the axial distance between object surface and the image surface.

18. Projection objective according to claim 10, wherein the mirror group entry is positioned geometrically close to a front pupil surface of the projection objective such that a radiation beam emanating from the object field includes the optical axis in the region of the mirror group entry.

19. Projection objective according to claim 18, wherein a front lens group designed as a Fourier lens group for performing one single Fourier transformation or an odd number of consecutive Fourier transformations is arranged between the object surface and the mirror group entry.

20. Projection objective according to claim 19, wherein the front lens group is purely refractive and performs a single Fourier transformation.

21. Projection objective according to claim 18, wherein the mirror group exit is arranged geometrically close to a rear pupil surface optically conjugate to the front pupil surface.

22. Projection objective according to claim 10, wherein one of two and three intermediate images are formed within the mirror group.

23. Projection objective according to claim 10, wherein the mirror group entry is positioned geometrically close to a front pupil surface of the projection objective such that a radiation beam emanating from the effective object field includes the optical axis in the region of the mirror group entry, wherein the mirror group exit is arranged geometrically close to a rear pupil surface optically conjugate to the front pupil surface, and wherein one of two and three intermediate images are formed within the mirror group.

24. Projection objective according to claim 18, wherein the mirror group exit is arranged geometrically close to a rear pupil surface, and a rear lens group is provided including a Fourier lens group for forming an intermediate image in a constriction region of the rear lens group, and a lens group downstream of the intermediate image designed as an imaging subsystem for imaging the intermediate image formed by the Fourier lens group onto the image surface on a reduced scale.

25. Projection objective according to claim 10, wherein all reflecting areas on the mirrors of the mirror group are positioned outside the optical axis.

26. Projection objective according to claim 10, wherein all reflecting areas on the mirrors of the mirror group are positioned optically remote from a pupil surface.

27. Projection objective according to claim 1, further comprising:
a mirror group having an object side mirror group entry, an image side mirror group exit, a first mirror having a first mirror surface for receiving radiation coming from the mirror group entry in a first reflecting area, and exactly one second mirror having a second mirror surface facing the first mirror surface for receiving radiation coming from the first mirror in a second reflecting area and for reflecting the radiation towards the mirror, group exit;
the first and second mirrors being concave mirrors having a concave mirror surface having a surface of curvature defining a mirror axis on the optical axis and being arranged on opposite sides of the optical axis;
wherein the first and second reflecting areas are positioned optically remote from a pupil surface.

28. Projection objective according to claim 27, wherein the mirror group is a purely reflective (catoptric) mirror group.

29. Projection objective according to claim 28, wherein the mirror group entry is positioned geometrically close to a front pupil surface of the projection objective such that a radiation beam emanating from the effective object field includes the optical axis in the region of the mirror group entry.

30. Projection objective according to claim 29, wherein a refractive front lens group designed as a Fourier lens group for performing one single Fourier transformation is arranged between the object surface and the mirror group entry.

31. Projection objective according to claim 27, wherein the mirror group exit is arranged outside the optical axis optically close to an intermediate image and wherein a rear lens group designed as an imaging subsystem for imaging that intermediate image onto the image surface on a reduced scale is arranged between the mirror group exit and the image surface.

32. Projection objective according to claim 1, designed as an immersion objective adapted with reference to aberrations such that an image side working distance between a last optical element and the image plane is filled up with an immersion medium with a refractive index substantially greater than 1.

33. Projection objective according to claim 1, having an image side numerical aperture NA>1.1 when used in connection with immersion.

34. A catadioptric projection objective for imaging an off-axis effective object field arranged in an object surface of the projection objective onto an off-axis effective image field arranged in an image surface of the projection objective comprising in that order along an optical axis:
a front lens group having positive refractive power for converging radiation coming from the effective object field towards a mirror group entry of a mirror group;
the mirror group having an object side mirror group entry and an image side mirror group exit; and
a rear lens group with positive refractive power for focussing radiation emerging from the mirror group exit onto the effective image surface;
wherein the mirror group includes at least two curved mirrors, where a curved mirror has a curved mirror surface for receiving radiation of a projection beam passing from the effective object field to the effective image field in a reflecting first area, the curved mirror surface defining a curvature surface including the mirror surface and extending beyond edges of the curved mirror;
where the projection beam is incident on the curvature surface at least once in a second area offset to the reflecting first area;
and where for all curved mirrors the conditions:

$$|R_{CRH}|<1/\alpha \text{ or } |R_{CRH}|>\alpha \qquad (1)$$

and $$\alpha=1.4 \qquad (2)$$

are fulfilled for a chief ray height ratio $R_{CRH}=CRH_1/CRH_2$ between a first chief ray height $CRH_1$ of a chief ray in the reflecting first area and a second chief ray height $CRH_2$ of the same chief ray in the associated second area.

35. Projection objective according to claim 34, wherein $\alpha=1.8$.

36. Projection objective according to claim 34, wherein the second area is a transmission area laterally offset to the mirror surface where the projection beam transits the curvature surface passing a mirror edge of the curved mirror.

37. Projection objective according to claim 34, wherein the second area is associated with a reflecting area of another curved mirror of the mirror group having a mirror surface in the vicinity of or coinciding with the curvature surface of the curved mirror.

38. Projection objective according to claim 34, wherein all curved mirrors are concave mirrors.

39. Projection objective according to claim 34, wherein the projection objective is an in-line system having one straight optical axis common to all optical elements.

40. Projection objective according to claim 34, designed as an immersion objective adapted with reference to aberrations such that an image side working distance between a last optical element and the image plane is filled up with an immersion medium with a refractive index substantially greater than 1.

41. Projection objective according to claim 34, having an image side numerical aperture NA>1.1 when used in connection with immersion.

42. Projection exposure system comprising:
an illumination system for receiving light from a light source and for forming an off-axis illumination field arranged outside an optical axis of the illumination system in an exit surface of the illumination system;
a catadioptric projection objective for projecting an image of a patterning structure arranged in an object surface of the projection objective onto an image surface of the projection objective;
where the object surface of the projection objective coincides with the exit surface of the illumination system and the illumination field of the illumination system defines a size and a shape of an off-axis effective object field of the projection objective arranged outside an optical axis of the projection objective;
a scanning device for moving the patterning structure in a scanning direction perpendicular to the optical axis of the projection objective;
the effective object field having a length A in the scanning direction and a width B perpendicular to the scanning direction such that a circular area of minimum size enclosing the effective object field defines a radius $R_{EOF}$ of the effective object field according to:

$$R_{EOF} = \sqrt{(A/2)^2 + (B/2)^2};$$

a circular design object field centered around the optical axis having a design object field radius $R_{DOF}$, where the projection objective is essentially corrected with respect to image aberrations in zones having radial coordinates smaller than $R_{DOF}$ and wherein the projection objective is not fully corrected in zones having radial coordinates larger than $R_{DOF}$, wherein the following conditions are fulfilled:

$R_{DOF} = \gamma R_{EOF}$ and $1 \leq \gamma \leq 1.2$.

43. Projection exposure system according to claim 42, wherein the effective object field is a ring field having an arcuate shape where an inner edge of the effective object field facing the optical axis and an outer edge of the effective object field remote from the optical axis are aligned transverse to the scanning direction and have the same arcuate shape, a translatory offset between the inner edge and the outer edge in the scanning direction defining the length A.

44. Projection exposure system according to claim 43, wherein the ring field is dimensioned such that lateral edge regions of the effective object field in a width direction perpendicular to the scanning direction overlap a cross-meridional plane through the optical axis and a center section of the inner edge has a radial distance from the optical axis.

45. Projection exposure system according to claim 43, wherein the outer edge has a center of curvature on the optical axis.

* * * * *